United States Patent [19]

Kijima et al.

[11] Patent Number: 5,821,005
[45] Date of Patent: Oct. 13, 1998

[54] FERROELECTRICS THIN-FILM COATED SUBSTRATE AND MANUFACTURE METHOD THEREOF AND NONVOLATILE MEMORY COMPRISING A FERROELECTRICS THINFILM COATED SUBSTRATE

[75] Inventors: Takeshi Kijima, Omiya; Sakiko Satoh, Yachiyo; Hironori Matsunaga, Noda; Masayoshi Koba, Nara, all of Japan

[73] Assignee: Sharp Kabushiki Kaisha, Osaka, Japan

[21] Appl. No.: 612,584

[22] Filed: Mar. 8, 1996

[30] Foreign Application Priority Data

Mar. 8, 1995 [JP] Japan ................................. 7-078338
Feb. 2, 1996 [JP] Japan ................................. 8-017909

[51] Int. Cl.⁶ ............................................ B32B 9/00
[52] U.S. Cl. .................... 428/701; 428/688; 257/295; 257/296; 257/297; 257/298; 117/104
[58] Field of Search ....................... 428/688, 701; 257/295, 296, 297, 298; 117/104

[56] References Cited

U.S. PATENT DOCUMENTS

| 5,248,564 | 9/1993 | Ramesh | 428/688 |
| 5,438,037 | 8/1995 | Tanaka | 505/329 |
| 5,514,484 | 5/1996 | Nashimoto | 428/700 |
| 5,548,475 | 8/1996 | Ushikubo et al. | 361/321.4 |
| 5,576,564 | 11/1996 | Satoh et al. | 257/295 |

FOREIGN PATENT DOCUMENTS

| 3-108 192 | 5/1991 | Japan . |
| 3-108 770 | 5/1991 | Japan . |
| 5-235 268 | 9/1993 | Japan . |
| WO 93/12538 | 6/1993 | WIPO . |
| WO 94/10702 | 5/1994 | WIPO . |

OTHER PUBLICATIONS

T. Nakamura et al., Integrated Ferroelectrics, vol. 6, pp. 35–46 (1995) no month avail.

T. Nakamura et al., Jpn. J. Appl. Phys., vol. 32, pp. 4086–4088 (1993) no month avail.

T. Kijima et al., Jpn. J. Appl. Phys. vol. 35, pp. 1246–1250 (1996) no month avail.

H. Matsunaga et al., Chemical Abstracts 124:248134 (1996) no month avail.

T. Nakamura et al., "Preparation of C–Axis–Oriented $Bi_4Ti_3O_{12}$ Thin Films by Metalorganic Chemical Vapor Deposition", *Jpn. J. Appl. Phys.*, vol. 32 (1993), pp. 4086–4088, Part 1, No. 9B, Sep. 1993.

G.A. Smolenskii et al., Soviet Phys. Solid State, A New Group of Ferroelectrics, 1, 149, 1959. no month available.

E.C. Subbarao, J. Phys. Chem. Solids, A Family of Ferroelectric Bismuth Compounds, 23, 665, 1962. no month available.

(List continued on next page.)

*Primary Examiner*—Stanley S. Silverman
*Assistant Examiner*—Sean Vincent
*Attorney, Agent, or Firm*—Birch, Stewart, Kolasch & Birch, LLP

[57] ABSTRACT

A ferroelectrics thin-film coated substrate is manufactured in a low-temperature process by using a ferroelectrics having a dense and even surface and exhibiting a large residual spontaneous polarization. A ferroelectrics thin-film coated substrate has a structure with a buffer layer, a growth layer allowing a ferroelectrics thin-film to grow, and a ferroelectrics thin-film made of a ferroelectric material having a layered crystalline structure expressed in the chemical formula $Bi_2 A_{m-1} B_m O_{3m+3}$ (A is selected from $Na^{1+}$, $K^{1+}$, $Pb^{2+}$, $Ca^{2+}$, $Sr^{2+}$, $Ba^{2+}$, $Bi^{3+}$ and the like, B is selected from $Fe^{3+}$, $Ti^{4+}$, $Nb^{5+}$, $Ta^{5+}$, $W^{6+}$ and $Mo^{6+}$, and m is an integer not less than 1) formed in succession.

12 Claims, 25 Drawing Sheets

OTHER PUBLICATIONS

S. Onishi et al., IEEE IEDM Technical Digest, A Half–Micron Ferroelectric Memory Cell . . . , p. 843, 1994. no month available.

Extended Abstracts, The Japan Society of Applied Physics, The 55th Autumn Meeting, 1994 (20p–M–19). no month available.

Extended Abstracts, The Japan Society of Applied Physics, The 42nd Spring Meeting, 1995 (29p–D–2). no month available.

Extended Abstracts, The Japan Society of Applied Physics, The 42nd Spring Meeting, 1995 (29p–D–3). no month available.

Extended Abstracts, The Japan Society of Applied Physics, The 56th Autumn Meeting, 1995 (27a–ZG–2). no month available.

Extended Abstracts, The Japan Society of Applied Physics, The 56th Autumn Meeting, 1995 (27a–ZG–3). no month available.

Extended Abstracts, The Japan Society of Applied Physics, The 43rd Spring Meeting, 1996 (28p–V–11). no month available.

T. Kijima et al., Extended Abstracts of the 1995 International Conference on Solid State Devices and Materials, Osaka, 1995, pp. 1071–1072. no month available.

T. Kijima et al., Jpn. J. Appl. Phys., Ultra–Thin Fatigue–Free . . . , vol. 35 (1996), pp. 1246–1250, Part 1, No. 2B, Feb. 1996. no month available.

Kuniaki Yoshimura et al., Journals of the Ceramic Society of Japan, Preparation of $Bi_4Ti_3O_{12}$ . . . , 102, [5], pp. 512–515 (1994). no month available.

(b)

100nm

1 μm

FERROELECTRICS THIN-FILM COATED SUBSTRATE AND MANUFACTURE METHOD THEREOF AND NONVOLATILE MEMORY COMPRISING A FERROELECTRICS THINFILM COATED SUBSTRATE

BACKGROUND OF THE INVENTION

1. Field of the Invention

The present invention refers to a ferroelectrics thin-film coated substrate used in a ferroelectrics memory element, a pyroelectric sensor element, a piezoelectric electric and the like, and a manufacture method thereof and the nonvolatile memory comprising a ferroelectrics thin-film coated substrate.

2. Description of the Related Art

Ferroelectrics many functions such as spontaneous polarization, high dielectric constant, electro-optic effect, piezoelectric effect, pyroelectric effect and the like, and are applied to a wide range of devices such as capacitor, oscillator, optical modulator or infrared sensor. So far, for use in these applications, single crystals, such as triglycine sulfate (TGS), $LiNbO_3$ and $LiTaO_3$ or sintered ceramics such as $BaTiO_3$, $PbTiO_3$, $Pb(Zr_{1-x} Ti_x)O_3$ (PZT) and PLZT, ferroelectric material, has been machined to the order of 50 $\mu$m in thickness by cutting and grinding. However, the large size of single crystal is difficult to prepare and expensive, and difficult to machine because of cleavage problems. In addition, ceramics are generally fragile and difficult to machine to a thickness of 50 $\mu$m or less due to the occurrence of cracks, so that much labor is required for machining and the cost of production becomes high.

On the other hand, with an advance in the formation technique of thin-film, the application field of these ferroelectric thin-films broadens. As one example, applying the characteristic of a high dielectric constant to capacitors in various semiconductor elements such as DRAM permits a high integration of elements by downsizing of capacitor area and the reliability promotion thereof. In particular, recently, ferroelectric nonvolatile memories (FRAM) operating in high density and at high speed by combining semiconductor memory elements such as a DRAM are extensively developed. Ferroelectric nonvolatile memories need no backup power supply by making use of a ferroelectric characteristic (hysteresis effect) of ferroelectrics. For development of such devices, materials having characteristics such as large residual spontaneous polarization (Pr), small reacting electric field (Ec), low leak current and large repetition resistance of polarization inversion are necessary. Furthermore, for adaptation to a decrease in operating current and the fine machining process of semiconductors, implementation of the above characteristics is desired from a thin-film 200 nm or less in thickness.

At present, for the purpose of application to FRAM or the like, an attempt is made to make oxide ferroelectrics such as $PbTiO_3$, PZT and PLZT into a thin-film by the thin-film forming method such as sputtering, evaporation, the sol-gel process and MOCVD.

Among the above ferroelectric materials, $Pb(Zr_{1-x} Ti_x)O_3$ (PZT) is recently being studied most intensively, from which thin-films of good ferroelectric characteristic are obtained by sputtering or the sol-gel process. For example, those having as large value of residual spontaneous polarization Pr of from 10 to 26 $\mu C/cm^2$ are obtained. However, there are problems that, although the ferroelectric characteristic of PZT largely depends on the composition x, a change in the composition of a thin-film is apt to occur during thin-film forming or during heat treatment on account of contained Pb having a high vapor pressure and that current leakage and a deteriorated resistance to polarization inversion occur with decreasing thickness of a thin-film (with thinner thin-film) as a result of occurrence of pinholes, and occurrence of a low ferroelectric layer due to a reaction of the underlying electrode Pt with Pb. Thus, it is desired to develop other materials excellent in ferroelectric characteristics and resistance to polarization inversion.

As a material improved in ferroelectric characteristics and excellent in resistance to polarization inversion, Y1 receives much attention. Y1 is a Bi-based layered oxide material, expressed in chemical formula $SrBi_2 Ta_2 O_9$, and produced by MOD process. The MOD process is a thin-film forming method comprising the following steps. As with the sol-gel process, organic metal materials are mixed to form a predetermined thin-film composition and a material solution for coating with the concentration and the viscosity adjusted is prepared. This solution is spin coated to the ground plate, dried and provisionally sintered. These steps are repeated until the thin-film reaches a predetermined thickness and finally the crystallization by a true sintering is accomplished. Accordingly, control of the thin-film thickness is restricted by the thickness of a one-time coated thin-film (cf. 1994 Autumn Applied Physics Meeting Preprints, 20p-M-19).

It is most critical in Y1 as ferroelectric material that the sintering temperature is extremely high as 750° C. to 800° C. and a further long sintering time of an hour or longer is necessary. That is because, when the steps of thin-film formation and heat treatment are performed at 650° C. or higher temperatures for a long period of time in such production process, a mutual diffusion reaction between the underlying platinum electrode and ferroelectrics and further a reaction between silicon or silicon oxide below the underlying electrode and ferroelectrics take place, and a change in thin-film composition due to the volatilization of component element from the ferroelectrics thin-film occurs, so that application to the actual production process of devices becomes difficult. For the present, since only a thin-film of as large particle size as 0.3 $\mu$m in the surface morphology is obtained, this production process cannot be applied to the submicron-sized fine machining necessary for the development of highly integrated device. Furthermore, since the obtained thin-film is a coating formed thin-film, there are such problems as deterioration of stepped section characteristic and breaking of wire. Thus, though excellent in ferroelectric characteristic and resistance to polarization inversion, Y1 has still a critical problem as ferroelectric material.

In addition, to implement the integration of ferroelectric nonvolatile memories, use of polycrystalline silicon for wiring between a MOS transistor and a ferroelectric capacitor is examined at present, but preparing a ferroelectrics thin-film such as the above Y1 thin-film in a long-time, high-temperature process has a problem that deterioration of characteristic due to the mutual diffusion between a polycrystalline silicon for wiring and a ferroelectric capacitor takes place. To solve such a problem, various structures with the diffusion barrier inserted are examined, but the tolerance of thin-film forming temperature is up to 650° C. and 700° C. is considered to be the limit also for other heat treatment steps if the process needs only a short time. However with the above Y1 or other dielectric thin-film under present circumstances, since not only crystallinity but also ferroelectric characteristic generally increases with higher thin-film forming temperature, the crystallinity and the ferroelectric characteristic deteriorate for lower thin-film forming temperature, so that compatibility between promoted dielectric characteristic and low-temperature thin-film forming is difficult.

On the other hand, oxide ferroelectrics not containing Pb adversely affecting the current leakage and resistance to polarization inversion include a group of bismuth based oxide ferroelectrics having layered crystal structures expressed in the following general chemical formulae.

$$Bi_2 A_{m-1} B_m O_{3m+3}$$

Here, A is selected from $Na^{1+}$, $K^{1+}$, $Pb^{2+}$, $Ca^{2+}$, $Sr^{2+}$, $Ba^{2+}$, $Bi^{3+}$ and the like, B is selected from $Fe^{3+}$, $Ti^{4+}$, $Nb^{5+}$, $Ta^{5+}$, $W^{6+}$ and $Mo^{6+}$, and m is an integer not less than 1. The crystal structures thereof have a fundamental structure in which a layered perovskite layer in an array of perovskite lattices composed of (m−1) $ABO_3$ is sandwiched by two layers of $(Bi_2 O_2)^{2+}$ from above and from below. Among these, many combinations of Sr, Ba or Bi as A with Ti, Ta or Nb as B exhibit ferroelectricity. The above Y1 is one type of these bismuth based oxide ferroelectrics.

Even among ferroelectrics expressed in the above chemical formulae, $Bi_4 Ti_3 O_{12}$ (bismuth titanate) is a ferroelectric having a strongly anisotropic layered perovskite structure (rhombic system/lattice constants: a=5.411 angstrom, b=5.448 angstrom and c=32.83 angstrom) and the ferroelectricity of its single crystal has the largest spontaneous polarization as indicated by Pr=50 $\mu C/cm^2$ and Ec=50 kV/cm in the a-axis direction and exhibits a surpassing characteristic. Thus, for applying a large spontaneous polarization inherent in this $Bi_4 Ti_3 O_{12}$ to ferroelectric nonvolatile memories and the like, it is desirable to arrange the a-axis component of more crystals perpendicularly to the surface of a substrate.

Attempts have thus far been made to make $Bi_4 Ti_3 O_{12}$ into a thinner thin-film by the MOCVD method and the sol-gel method, but almost all of these attempts relate to a c-axis orientation thin-film less in spontaneous polarization than a-axis orientation thin-film. In addition, with a conventional sol-gel method, since the heat treatment at above 650° C. is necessary for obtaining a good ferroelectric characteristic and further the thin-film surface morphology comprises crystal grains on the order of 0.5 μm, application to a highly integrated device requiring the fine machining is difficult. On the other hand, with the MOCVD method, a c-axis oriented $Bi_4 Ti_3 O_{12}$ thin-film is prepared at substrate temperatures of 600° C. or higher on a $Pt/SiO_2/Si$ substrate or on a Pt substrate, but these substrates cannot be directly applied to an actual device structure. That is, as with the $Pt/Ti/SiO_2/Si$ substrate, an adhesive layer, such as Ti layer, for ensuring the adhesive strength between the Pt electrode layer and its underlying $SiO_2$ layer is necessary. Nevertheless, it was reported that, when preparing a thin $Bi_4 Ti_3 O_{12}$ thin-film on the Pt electrode layer provided with such an adhesive layer by the MOCVD process, its thin-film surface morphology comprises coarse crystal grains and moreover the Pyrochlore phase ($Bi_2 Ti_2 O_7$) becomes apt to occur (cf. Jpn. J. Appl. Phys., 32, 1993, pp. 4086 and J. Ceramic Soc. Japan, 102, 1994, pp. 512). When the thin-film surface morphology comprises coarse crystal grains, application to a highly integrated device requiring a fine machining is impossible and moreover pin holes are still more apt to be caused for the thinner thin-film and consequently occurrence of leak current is induced. In addition, since the pyrochlore phase exhibits no ferroelectricity, mixing of the pyrochlore phase leads to deterioration of ferroelectricity on the whole thin-film. Thus, under such circumstances of conventional art, it is difficult to implement a ferroelectric thin-film, 200 nm thick or thinner, having a good ferroelectric characteristic.

As described above, the above prior art has problems in that, in applying a ferroelectric thin-film to highly integrated devices, thin films satisfactorily meeting the denseness and the evenness of the surface of a thin-film required for fine machining or low current leakage a large residual spontaneous polarization, and various requirements for the low-temperature thin-film forming process are not yet obtained.

For solving the problems mentioned above, it is one object of the present invention to provide a ferroelectric substrate having a dense and even surface and a large residual spontaneous polarization which can be prepared in the low-temperature thin-film forming process, and the manufacture method thereof, and a nonvolatile memory composed thereof.

SUMMARY OF THE INVENTION

With the present invention, for solving the problem mentioned above, the ferroelectrics thin-film coated substrate comprises a buffer layer, a growth layer for growing a ferroelectrics thin-film, and a ferroelectric layer made of ferroelectric material having a layered structure expressed in a chemical formula $Bi_2 A_{m-1} B_m O_{3m+3}$, where A is selected from $Na^{1+}$, $K^{1+}$, $Pb^{2+}$, $Ca^{2+}$, $Sr^{2+}$, $Ba^{2+}$, $Bi^{3+}$ and the like, B is selected from $Fe^{3+}$, $Ti^{4+}$, $Nb^{5+}$, $Ta^{5+}$, $W^{6+}$ and $Mo^{6+}$, and m is an integer not less than 1, successively formed on a substrate.

And, in a ferroelectrics thin-film coated substrate according to the present invention, the growth layer comprises an oxide containing the component elements of a bismuth-based oxide ferroelectric material expressed in the above chemical formula $Bi_2 A_{m-1} B_m O_{3m+3}$ constituting its ferroelectrics thin-film.

And, in a ferroelectrics thin-film coated substrate according to the present invention, the growth layer comprises a material having a layered crystal structure expressed in a chemical formula $Bi_2 A_{m-1} B_m O^{3m+3}$, where A is selected from $Na^{1+}$, $K^{1+}$, $Pb^{2+}$, $Ca^{2+}$, $Sr^{2+}$, $Ba^{2+}$, $Bi^{3+}$ and the like, B is selected from $Fe^{3+}$, $Ti^{4+}$, $Nb^{5+}$, $Ta^{5+}$, $W^{6+}$ and $Mo^{6+}$, and m is an integer not less than 1.

And, in a ferroelectrics thin-film coated substrate according to the present invention, the growth layer and the ferroelectrics thin-film comprises one and the same material and the buffer layer comprises a material containing the component elements constituting its growth layer and ferroelectric material.

And, with the present invention, in the above ferroelectrics thin-film coated substrate, the ferroelectrics thin-film, the growth layer and the buffer layer comprise $Bi_4 Ti_3 O_{12}$, $Bi_4 Ti_3 O_{12}$ and titanium oxide, respectively.

In addition, with the present invention, a manufacture method of a ferroelectrics thin-film coated substrate by forming a buffer layer and a ferroelectrics thin-film on a substrate in accordance with the MOCVD according to the present invention, is so arranged that a growth layer for allowing a ferroelectrics thin-film to grow is formed on the buffer layer after forming a buffer layer and further a ferroelectrics thin-film is formed on the growth layer at lower thin-film forming temperatures than that of the growth layer.

And with the present invention, the above method for producing a ferroelectrics thin-film coated substrate is so arranged that a bismuth-based oxide ferroelectrics thin-film having a layered crystal structure is formed as the ferroelectrics thin-film, a bismuth-based oxide ferroelectrics thin-film of the same material as that of said ferroelectrics thin-film is formed as the growth layer, and a thin-film containing the component elements of the material constituting the growth layer and the ferroelectrics thin-film is formed as the buffer layer.

And with the present invention, the above method for producing a ferroelectrics thin-film coated substrate is so arranged that after forming a titanium oxide thin-film as said buffer layer, a $Bi_4 Ti_3 O_{12}$ thin-film is formed at thin-film forming temperatures of 400° C. to 650° C. as said growth layer and a $Bi_4 Ti_3 O_{12}$ thin-film is formed at thin-film forming temperatures of 300° C. to 400° C. as said ferroelectric thin-film.

And with the present invention, the above method for manufacturing a ferroelectrics thin-film coated substrate is so arranged that the thin-film forming temperature of $Bi_4 Ti_3 O_{12}$ thin-film of the growth layer is set at 400° C. to 470° C.

In addition, with the present invention, a method for manufacturing a ferroelectrics thin-film coated substrate by forming a buffer layer and a ferroelectrics thin-film on a substrate in accordance with the MOCVD process is so arranged that, after forming a buffer layer on a substrate, a growth layer for allowing a ferroelectrics thin-film to grow is formed on the buffer layer, a ferroelectrics layer is formed on the growth layer at lower thin-film forming temperatures than that of the growth layer, and heat treatment is applied.

And with the present invention, the above method for manufacturing a ferroelectrics thin-film coated substrate is so arranged that, after forming a titanium oxide thin-film as said buffer layer, a $Bi_4 Ti_3 O_{12}$ thin-film is formed at thin-film forming temperatures of 400° C. to 650° C. as said growth layer, a $Bi_4 Ti_3 O_{12}$ thin-film is formed at thin-film forming temperatures of 300° C. to 400° C. as said ferroelectric thin-film, and heat treatment at 500° C. to 700° C. is applied.

And with the present invention, in the above method for manufacturing a ferroelectrics thin-film coated substrate, the thin-film forming temperature of $Bi_4 Ti_3 O_{12}$ thin-film of said growth layer is set at 400° C. to 470° C.

In addition, with the present invention, a nonvolatile memory having a capacitor structure, comprising the above-mentioned ferroelectrics thin-film coated substrate.

Further more, with the present invention, a nonvolatile memory having an MFMIS-FET structure comprising the above-mentioned ferroelectrics thin-film coated substrate.

The layered crystal structure expressed in a chemical formula $Bi_2 A_{m-1} B_m O_{3m+2}$ where A is selected from $Na^{1+}$, $K^{1+}$, $Pb^{2+}$, $Ca^{2+}$, $Sr^{2+}$, $Ba^{2+}$, $Bi^{3+}$, and the like, B is selected from $Fe^{3+}$, $Ti^{4+}$, $Nb^{5+}$, $Ta^{5+}$, $W^{6+}$ and $Mo^{6+}$, and m is an integer not less than 1, is a crystal structure formed by the alternate stacking of $(Bi_2 O_2)^{2+}$ layers and $(A_{m-1} B_m O_{3m+3})^{2-}$ layers. Incidentally, selection of A and B here is not limited to a single way.

Typical of ferroelectric materials having such a crystal structure is $Bi_4 Ti_3 O_{12}$. And, others are $SrBi_2 Nb_2 O_9$, $SrBi_2 Ta_2 O_9$, $BaBi_2 Nb_2 O_9$, $BaBi_2 Ta_2 O_9$, $Pb_2 Bi_2 Nb_2 O_9$, $PbBi_2 Ta_2 O_9$, $SrBi_4 Ti_4 O_{15}$, $BaBi_4 Ti_4 O_{15}$, $PbBi_4 Ti_4 O_{15}$, $Na_{0.5} Bi_{4.5} Ti_4 O_{15}$, $K_{0.5} Bi_{4.5} Ti_4 O_{15}$, $Sr_2 Bi_4 Ti_5 O_{18}$, $Ba_2 Bi_4 Ti_5 O_{18}$ and $Pb_2 Bi_4 Ti_5 O_{18}$. In contrast to these, ferroelectric materials expressed in the same chemical formula, having a layered crystal structure and exhibiting no ferroelectric characteristic include $Bi_3 TiNbO_9$, $Bi_3 TiTaO_9$, $CaBi_2 Nb_2 O_9$, $CaBi_2 Ta_2 O_9$ and $CaBi_4 Ti_4 O_{15}$.

According to the present invention, in ferroelectrics thin-film coated substrates made by forming ferroelectrics thin-films composed of these bismuth-based oxide ferroelectric materials on a substrate, the interposition of both a buffer layer and a growth layer for allowing the ferroelectrics thin-film to grow between the substrate and the ferroelectrics thin-film enables a marked upgrade in crystallinity, ferroelectricity, electrical properties, thin-film properties and the like.

The detail will be described later, but such operations of the present invention was examined composing a ferroelectrics thin-film of $Bi_4 Ti_3 O_{12}$, representative of the above ferroelectric materials, and employing a $Bi_4 Ti_3 O_{12}$ thin-film as the growth layer and a titanium oxide thin-film as the buffer layer. As a result, it was firstly found that the ferroelectrics thin-film formed a random orientation thin-film. According to this random orientation thin-film, since use can be made of the a-axis orientated component unlike a formerly reported c-axis oriented thin-film made of $Bi_4 Ti_3 O_{12}$ ferroelectrics, the residual spontaneous polarization of a ferroelectrics thin-film can be greatly promoted.

Secondly, according to the present invention, it was found in the thin-film surface of a $Bi_4 Ti_3 O_{12}$ ferroelectrics thin-film that no such c-plane platelike coarse crystalline grain as present in a conventional $Bi_4 Ti_3 O_{12}$ ferroelectrics thin-film was seen, very fine crystalline grains were observed and a very dense and smooth thin-film surface morphology was obtained. Thus, in a ferroelectrics thin-film according to the present invention, since no leak current is generated by pinholes originating in composition of coarse crystalline grains, a highly low leak current characteristic can be manifested and further the fatigue resistance can also be greatly promoted. Since an excellent thin-film surface morphology is exhibited in this way, a fine machining is enabled and the present invention is applicable to a highly integrated device.

It is attributable to the buffer layer and the growth layer that a very good bismuth-based ferroelectrics thin-film is obtained like this according to the present invention. From an observation of the thin-film surface and the crystallinity of the growth layer ($Bi_4 Ti_3 O_{12}$ thin-film) formed on the titanium oxide buffer layer, it is considered that the surface morphology and the crystallinity of a ferroelectrics thin-film becomes equivalent to those of the growth layer as if succeeded to them.

From such results, the present invention can be thought to be effective for those composed of dielectric materials expressed in the above-mentioned chemical formula $Bi_2 A_{m-1} B_m O_{3m+3}$ having a layered crystal structure similar to that of a $Bi_4 Ti_3 O_{12}$ as the ferroelectrics thin-film. In addition, as the growth layer, since those indicating a crystal structure resembling that of a ferroelectrics thin-film is thought to be preferable, those composed of oxide materials containing the component elements of a ferroelectrics thin-film or bismuth-based oxide materials having a layered structure similar to that of a ferroelectrics thin-film can be regarded as preferable. Furthermore, as for the buffer layer, those composed of the component elements of the ferroelectrics thin-film and the growth layer can be regarded as preferable.

On the other hand, in a method for manufacturing a ferroelectrics thin-film coated substrate according to the present invention, to produce the above ferroelectrics thin-film coated substrate by the MOCVD process, especially when forming a ferroelectrics thin-film on the growth layer for allowing the ferroelectrics thin-film to grow, the above-mentioned ferroelectrics thin-film coated substrate according to the present invention is implemented by forming a ferroelectrics thin-film at lower temperatures than the thin-film forming one of the growth layer for a ferroelectrics thin-film.

The detail will be described in the preferred arrangement, but a method for manufacturing a ferroelectrics thin-film coated substrate according to the present invention was examined employing a ferroelectrics thin-film of $Bi_4 Ti_3 O_{12}$, representative of the above ferroelectric materials, and forming a $Bi_4 Ti_3 O_{12}$ thin-film as the growth layer and a titanium oxide thin-film as the buffer layer.

As a result, it was found that a random orientation thin-film of $Bi_4 Ti_3 O_{12}$ ferroelectrics thin-film could be formed by forming a growth layer ($Bi_4 Ti_3 O_{12}$ thin-film) at thin-film forming temperatures of 400° C. to 650° C. and a $Bi_4 Ti_3 O_{12}$ ferroelectrics thin-film at lower temperatures of 300° C. to 400° C. than the growth layer forming one. Furthermore, by controlling the thin-film forming temperature of the growth layer ($Bi_4 Ti_3 O_{12}$ thin-film) within the range of 400° C. to 650° C., the crystallinity (orientation) of a ferroelectrics thin-film was found to be controllable. This control is possible because, by intensifying either one of the random oriented component and the c-axis oriented component in the oriented components in a $Bi_4 Ti_3 O_{12}$ ferroelectrics thin-film of random orientation thin-film, the residual spontaneous polarization of the ferroelectrics thin-film can be increased or the reacting electric field can be decreased. Thus, corresponding to an actually applying device, an appropriate characteristic of ferroelectrics thin-films can be freely selected, thereby promoting the degree of freedom greatly.

Furthermore, with the manufacture method according to the present invention, since a $Bi_4 Ti_3 O_{12}$ ferroelectrics thin-film can be formed at by far lower temperatures of 300° C. to 400° C. than conventional one of thin-film forming, a very dense and smooth thin-film can be implemented. In addition, because the above thin-film forming process can be performed at the temperature of 650° C. or less, it is very effectively applied to a highly integrated device.

By setting the thin-film forming temperature of the above growth layer ($Bi_4 Ti_3 O_{12}$ thin-film) in the range of 400° C. to 470° C., the randomly oriented component can be intensified and the residual spontaneous polarization of a ferroelectrics thin-film can be very greatly increased as compared with a conventional one by effectively utilizing the a-axis oriented component of $Bi_4 Ti_3 O_{12}$.

Furthermore, by applying the heat treatment step after such a thin-film forming step as mentioned above, the crystallinity of a ferroelectrics thin-film can be further enhanced, the residual spontaneous polarization can be increased and the leak current characteristic can be noticeably improved. For a $Bi_4 Ti_3 O_{12}$ ferroelectrics thin-film, the heat treatment temperature is effective in the range of 500° C. to 700° C., and since the effect is obtained by a short-time treatment even around 700° C., no adverse effect is exerted even on a highly integrated device in application.

Because of comprising the above-mentioned ferroelectrics thin-film coated substrate, capacitor-structured nonvolatile memories according to the present invention can exhibit a sufficient characteristic.

Because of comprising the above-mentioned ferroelectrics thin-film coated substrate, MFMIS-FET-structured nonvolatile memories according to the present invention can exhibit a sufficient characteristic.

Further objects and advantages of the present invention will be apparent from the following description of the preferred embodiments of the present invention as illustrated in the accompanying drawings.

DESCRIPTION OF THE PREFERRED EMBODIMENTS

Figure 1:
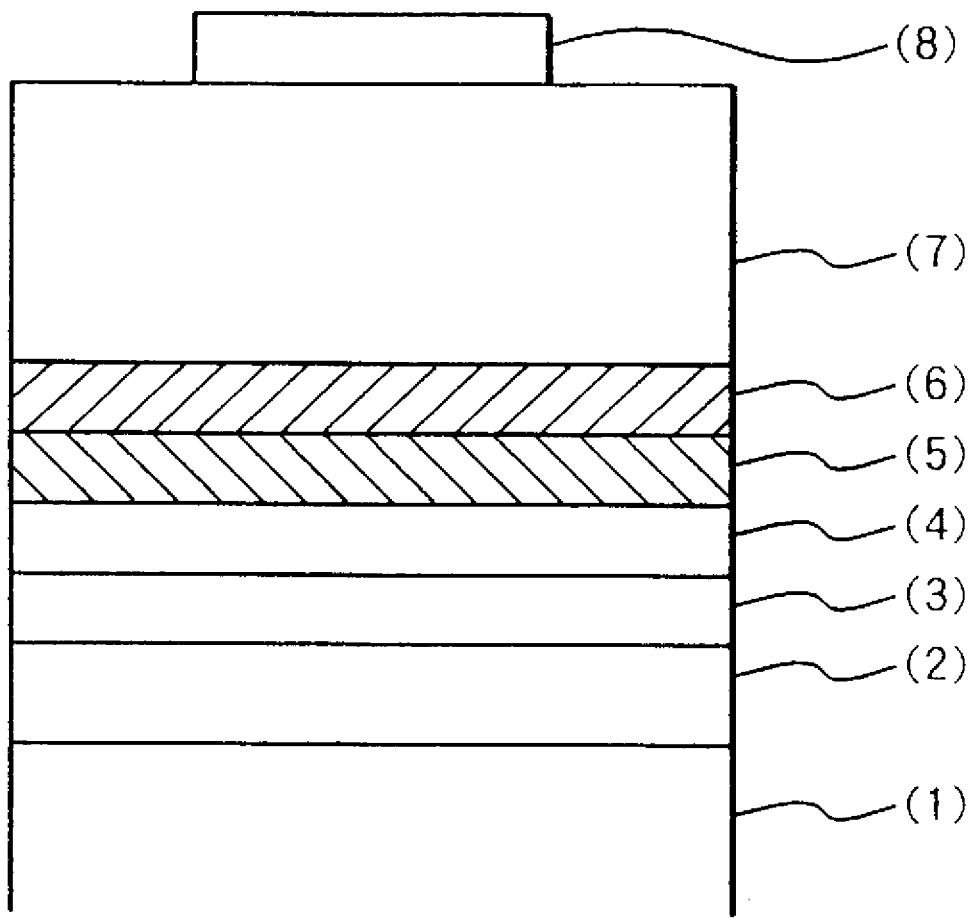
FIG. 1 is a sectional schematic view showing the structure of ferroelectrics thin-film coated substrate according to the present invention.

Hereinafter, the preferred arrangements of the present invention will be described referring to the drawings.

FIG. 1 shows the structure of a ferroelectrics thin-film substrate according to a first arrangement of the present invention. As shown in FIG. 1, this ferroelectrics thin-film coated substrate comprises a silicon oxide ($SiO_2$) layer 2, an adhesive layer 3, a lower electrode layer 4, a buffer layer 5, a growth layer for allowing a ferroelectrics thin-film to grow 6, a ferroelectrics thin-film 7 and an upper electrode layer 8 successively formed on a silicon (Si) substrate 1.

With the first arrangement, a silicon single crystal wafer was employed as the silicon substrate 1, while a silicon oxide thin-film obtained by thermally oxidizing the surface of the silicon single crystal wafer was employed as the $SiO_2$ layer 2. In addition, a tantalum (Ta) thin-film, a platinum (Pt) thin-film, a titanium oxide thin-film, a $Bi_4 Ti_3 O_{12}$ thin-film, a $Bi_4 Ti_3 O_{12}$ thin-film and a platinum (Pt) thin-film are employed as the adhesive layer 3, the lower electrode layer 4, a buffer layer 5, a growth layer 6, a ferroelectrics thin-film 7 and an upper electrode layer 8, respectively.

Next, the method for producing a ferroelectrics thin-film coated substrate according to the first arrangement shown in FIG. 1 will be described.

First, preparation of a $Pt/Ta/SiO_2/Si$ substrate will be described. By thermal oxidation of the surface of (100) plane in a silicon single crystal wafer as the silicon substrate 1, a $SiO_2$ layer 2, 200 nm in thin-film thickness, is formed. Then, a Ta thin-film as the adhesive layer 3, 30 nm in thin-film thickness, and a Pt thin-film as the lower electrode layer 4, 200 nm in thin-film thickness, are formed respectively by the sputter method.

Here, these materials and the thin-film thickness are not limited to this arrangement, but a polycrystalline silicon substrate, a GaAs substrate or the like may be also employed. In addition, the adhesive layer is provided for preventing the peeling of a thin-film from occurring during the thin-film forming due to a difference in thermal expansion coefficient between the substrate and the lower electrode layer, the thin-film thickness is only necessary to be as thick as capable of preventing the peeling of a thin-film. Other materials such as titanium (Ti) than Ta may be employed, but Ta is preferable because Ti and Pt form an alloy. The $SiO_2$ layer employed for the insulating layer may not be prepared by heat treatment, an $SiO_2$ thin-film, a silicon nitride thin-film or the like are formed by the sputtering process, the vapor deposition process and the like. Any material and any thin-film thickness are allowable so long as a sufficient insulation is ensured.

Similarly, with respect to the lower electrode layer, the thin-film thickness is only required to be as large as equal to the function of an electrode and the material is not limited to Pt but may be metal materials employed for ordinary electrode materials and can be appropriately selected in relation to other thin-film. In addition, a thin-film formation method is also not limited to the silicon oxidation process or the sputtering process heretofore and ordinary thin-film forming techniques such as vapor deposition may be employed. Furthermore, the structure of a substrate is also not limited to the above-mentioned.

Then, after forming a titanium oxide thin-film of buffer layer and a $Bi_4 Ti_3 O_{12}$ thin-film of growth layer by the MOCVD process on the $Pt/Ta/SiO_2/Si$ substrate prepared in this manner, the surface morphology and the orientation were observed for varied thin-film forming conditions of the growth layer.

For the thin-film formation of a titanium oxide of buffer layer, titanium isopropoxide ($Ti(i-OC_3 H_7)_4$) was used as a raw material for titanium, heated to 50° C., gasified and supplied into a thin-film forming chamber together with argon (Ar) gas of carrier gas. Here, the flow rate at the Ar gas supply was set at 100 sccm. And with $Pt/Ta/SiO_2/Si$ substrate prepared as described above heated and kept at a definite temperature in the thin-film forming chamber, a 5 nm thick titanium oxide thin-film was formed on this substrate. At that time, the time taken for the forming step of a titanium oxide was on the order of 30 sec.

Thereafter, a $Bi_4 Ti_3 O_{12}$ thin-film of growth layer is continuously formed in a thickness of 45 nm on this titanium oxide thin-film at the same temperature. FIG. 1 shows the supply conditions of raw materials for the thin-film forming by the MOCVD process at this time.

TABLE 1

| Raw material | $Bi(o - C_7H_7)_3$ | $Ti(i - OC_3H_7)_4$ |
|---|---|---|
| Raw material temperature | 160° C. | 50° C. |
| Carrier gas (Ar) flow rate | 200 sccm | 100 sccm |
| Reactant gas ($O_2$) flow rate | | 1000 sccm |
| Reaction pressure | | 5 Torr |

As shown in FIG. 1, using triorthotolylbiryl bismuth ($Bi(o-OC_7 H_7)_3$) and titanium isopropoxide ($Ti (i-OC_3 H_7)_4$) as raw materials for bismuth and titanium, respectively for forming a $Bi_4 Ti_3 O_{12}$ thin-film, these raw materials were heated and gasified at respective raw material temperatures shown in FIG. 1 (160° C. for bismuth raw material and 50° C. for titanium raw material) and supplied into the thin-film forming chamber together with a carrier gas of argon (Ar) gas and a reactant gas of oxygen ($O_2$). Here, the flow rate of Ar gas at the supply was set at 200 sccm for Bi raw material and 100 sccm for Ti raw material, while the flow rate of $O_2$ gas at the supply was set at 1000 sccm. Incidentally, in these thin-film forming steps, the degree of vacuum in the thin-film forming chamber was set at 5 Torr, because the gaseous phase reaction is apt to occur if it is above 10 Torr.

Here, setting the thin-film forming temperature, i.e., the substrate temperature at 450° C. and 500° C., two kinds of samples, 50 nm in the total thickness of a titanium oxide buffer layer and a $Bi_4 Ti_3 O_{12}$ thin-film (growth layer), were prepared. The thin-film thickness of $Bi_4 Ti_3 O_{12}$ thin-film (growth layer) here was set at 45 nm, and was made rather larger at any rate for purposes of observing the surface morphology and the crystallinity.

In addition, for comparison, a control was also prepared in which no titanium oxide buffer layer was formed and a $Bi_4 Ti_3 O_{12}$ thin-film was formed directly on the $Pt/Ta/SiO_2/$ Si substrate in a thickness of 150 nm. Except that no titanium oxide buffer layer was formed and the thin-film forming temperature was set at 500° C., the thin-film forming conditions for this control are quite the same as with the samples mentioned above.

Figure 2A:
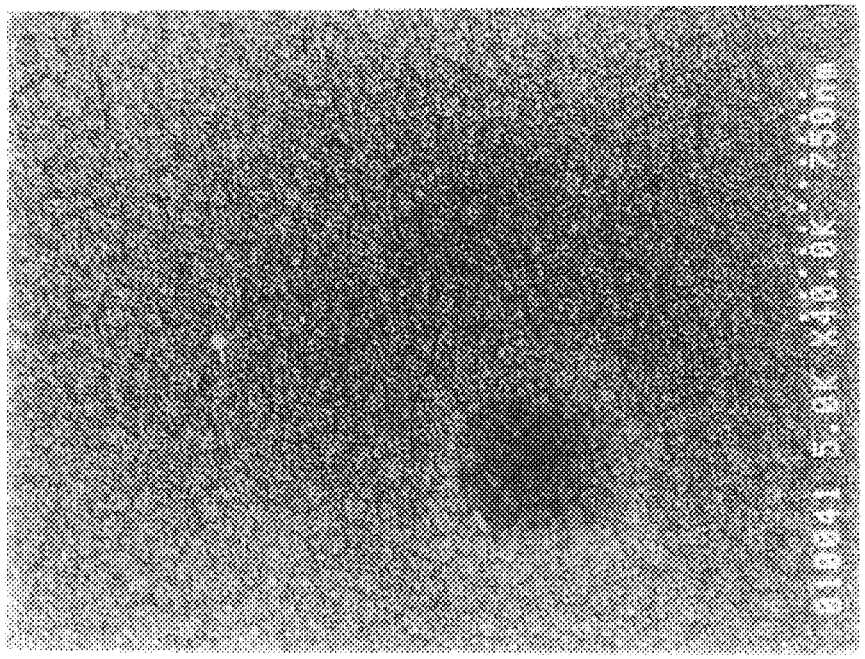
FIGS. 2A and 2B are photographs showing the SEM observed results of the surface of a first arrangement of $Bi_4 Ti_3 O_{12}$ thin-film (growth layer)
Figure 2B:
Figure 3:
FIG. 3 is a photograph showing the SEM observed result of the surface of a control of $Bi_4 Ti_3 O_{12}$ thin-film.
Figure 4A:
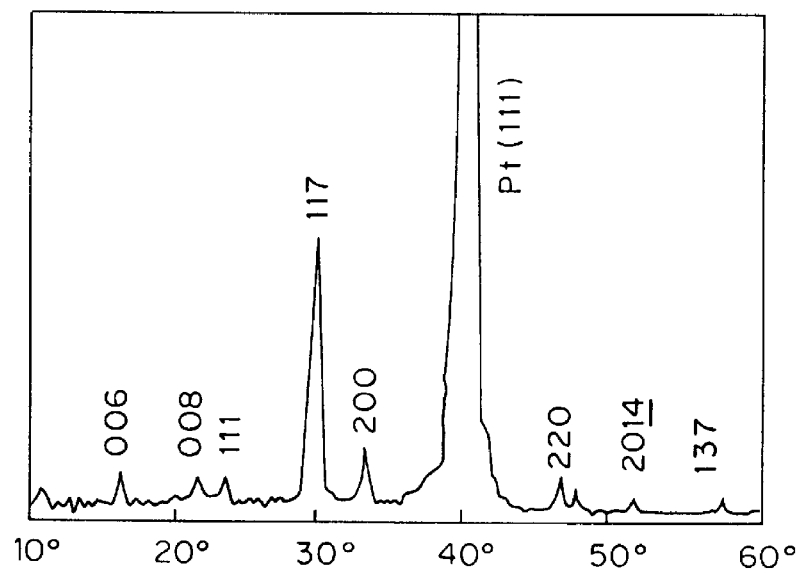
FIGS. 4A and 4B are graphs showing the X-ray diffraction observed results of the surface of a first arrangement of $Bi_4 Ti_3 O_{12}$ thin-film (growth layer)
Figure 4B:
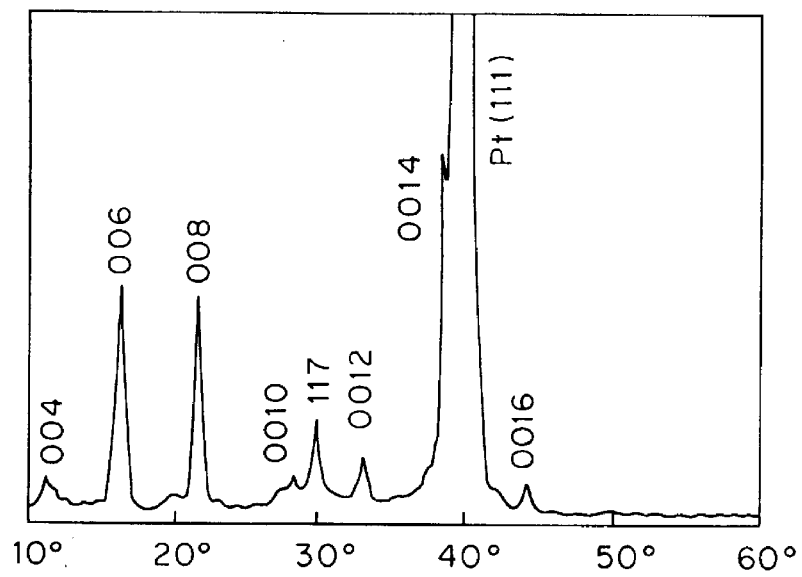
Figure 5:
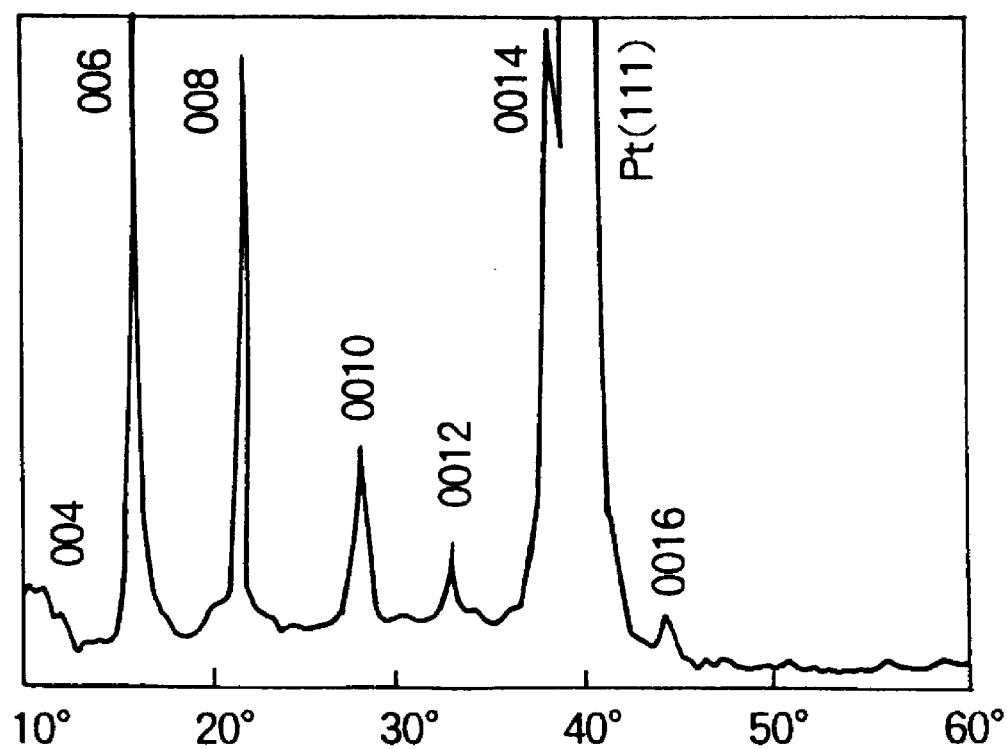
FIG. 5 is a graph showing the X-ray diffraction observed result of the crystallinity of a control of $Bi_4 Ti_3 O_{12}$ thin-film.

For the two sorts of samples having a titanium oxide buffer layer and the control prepared in this manner, observation of the surface morphology under SEM (Scanning Electron Microscope) and observation of the crystallinity on X-ray diffractometer were carried out. At this time, FIGS. 2A, 2B and 3 show the SEM observed results, while FIGS. 4A, 4B and 5 shows the observed results on X-ray diffractometer. In the thin-film forming temperature (substrate temperature), FIGS. 2A and 4A relate to samples of 450° C. and FIGS. 2B and 4B relate to samples of 500° C., respectively. FIGS. 3 and 5 show the respective observed results of controls without titanium oxide buffer layer.

According to the SEM photos of FIGS. 2A and 2B, it is found that samples with the titanium oxide buffer layer formed exhibit a very dense and smooth thin-film surface morphology with crystalline grains on the order of nm and on the order of 10 nm respectively for FIG. 2A sample and for FIG. 2B sample. This becomes clear if compared with the result of the control without titanium oxide buffer layer shown in FIG. 3 that exhibits a rough uneven surface morphology of platelike coarse crystalline grains ($\mu$m order) formed. In FIG. 2A, a circularly blackened portion is seen in part, but it is a burn generated by electron irradiation during the SEM observation and does not represent a defect or the like on the surface of a thin-film.

In FIGS. 4A, 4B and 5, all diffraction peaks but the Pt (111) peak are attributed to the $Bi_4 Ti_3 O_{12}$. (00n) (n: integer) denotes the c-axis orientation, (n00) denotes the a-axis orientation, the others such as (117) denotes random orientations. Accordingly, according to FIGS. 4A and 4B, the sample of FIG. 4A, having a large diffraction peak of (117), small c-axis oriented diffraction peaks of (006) and (008), and a small a-axis oriented diffraction peaks of (200), is found to be randomly oriented. As compared with that of FIG. 4A, the sample of FIG. 4B, having a smaller diffraction peak of (117), larger c-axis oriented diffraction peaks of (006) and (008), is found to be more oriented in c-axis. Meanwhile, in FIG. 5, only c-axis oriented diffraction peaks of (00n) (n: integer) are indicated and therefore the control exhibits the c-axis orientation containing no random orientation.

In this way, it was found from these results of SEM and X-ray diffraction observation that samples with the titanium oxide buffer layer formed exhibit a very dense, smooth and good thin-film surface morphology and forms a random orientation thin-film containing components other than that of the c-axis orientation. Furthermore, it was found that those of 450° C. in the thin-film forming temperature (substrate temperature) of the titanium oxide buffer layer and the $Bi_4 Ti_3 O_{12}$ thin-film exhibit a denser and smoother surface morphology than those of 500° C. and are superior in random orientation for crystallinity.

Then, preparation of a structure that a titanium oxide buffer layer, a $Bi_4 Ti_3 O_{12}$ thin-film of growth layer and a $Bi_4 Ti_3 O_{12}$ thin-film of ferroelectrics thin-film are successively formed on a Pt/Ta/SiO$_2$/Si substrate will be described.

The thin-film forming reaching to the $Bi_4 Ti_3 O_{12}$ thin-film of growth layer is carried out in quite the same manner as that described above except for setting the thickness of a $Bi_4 Ti_3 O_{12}$ thin-film of growth layer to 5 nm. Also in this case, two types of samples were prepared setting the thin-film forming temperature (the substrate temperature) of a $Bi_4 Ti_3 O_{12}$ thin-film (growth layer) at 450° C. and 500° C. The time taken for the thin-film forming step of a $Bi_4 Ti_3 O_{12}$ thin-film growth layer was around 30 sec for any sample.

After the forming procedure reaching to the forming of a $Bi_4 Ti_3 O_{12}$ thin-film (growth layer) was accomplished in the same manner as described above, the supply of raw materials was once ceased. After setting the substrate temperature at 400° C., a Bi raw material, a Ti raw material, a carrier gas (Ar) and a reactant gas (O$_2$) are supplied again into the thin-film forming chamber, and the thin-film forming of a $Bi_4 Ti_3 O_{12}$ of ferroelectrics thin-film was carried out in a thickness of 90 nm by the MOCVD process with the degree of vacuum in the thin-film forming chamber set at 5 Torr. Here, except for the substrate temperature (thin-film forming temperature), the thin-film forming conditions for a $Bi_4 Ti_3 O_{12}$ of ferroelectrics thin-film are quite the same as those of a $Bi_4 Ti_3 O_{12}$ thin-film of growth layer described using Table 1. At this time, the time taken for the thin-film forming step of a $Bi_4 Ti_3 O_{12}$ thin-film of ferroelectrics thin-film was around 30 min for any sample, and therefore the time taken for the thin-film forming step of a buffer layer, a growth layer and a ferroelectrics thin-film is nearly equal to 30 min in total for any sample.

Here, for the $Bi_4 Ti_3 O_{12}$ thin-film of ferroelectrics thin-film formed on the Pt/Ta/SiO$_2$/Si substrate via the titanium oxide buffer layer and the $Bi_4 Ti_3 O_{12}$ thin-film of growth layer in this manner, the results obtained by the observation of the surface morphology under SEM (Scanning Electron Microscope) and observation of the crystallinity on X-ray diffractometer will be described.

Figure 6A:
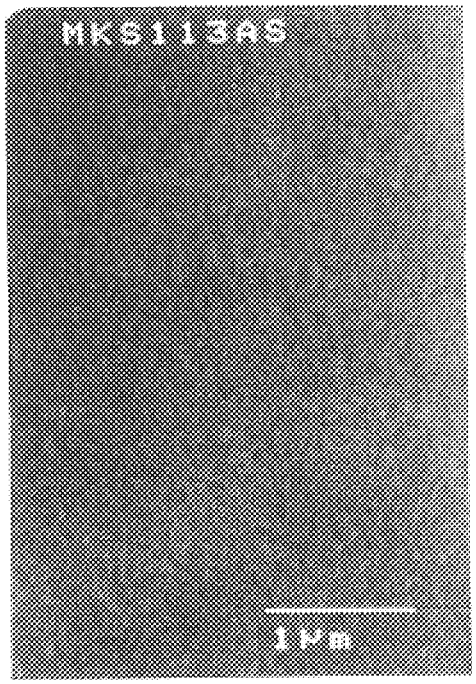
FIGS. 6A and 6B are photographs showing the SEM observed results of the surface of a first arrangement of $Bi_4 Ti_3 O_{12}$ ferroelectrics thin-film.
Figure 6B:
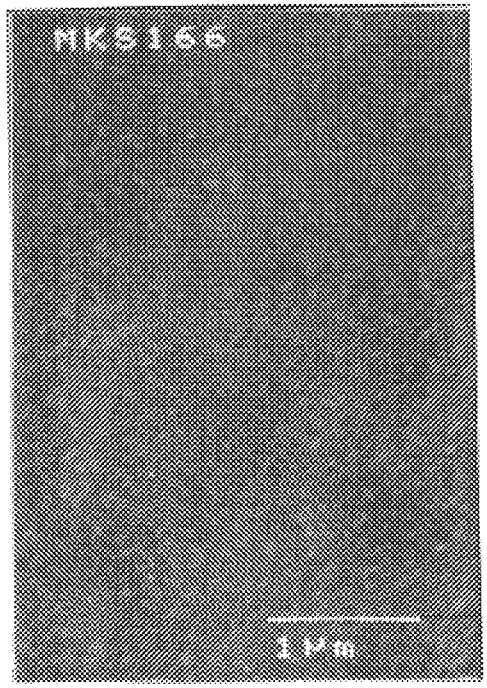
Figure 7A:
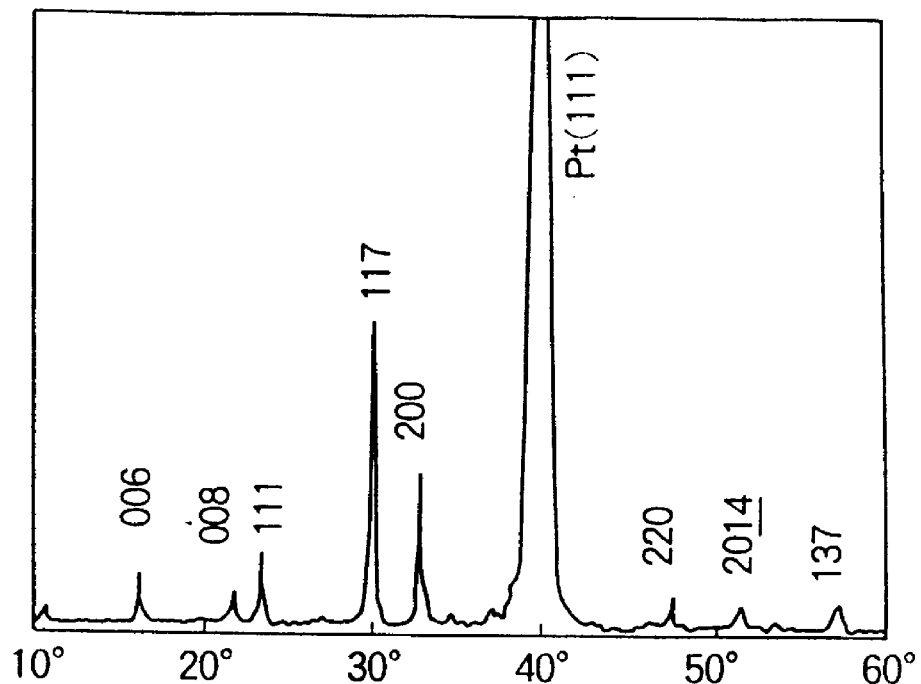
FIGS. 7A and 7B are graphs showing the X-ray diffraction observed results of the crystallinity of a first arrangement of $Bi_4 Ti_3 O_{12}$ ferroelectrics thin-film.
Figure 7B:
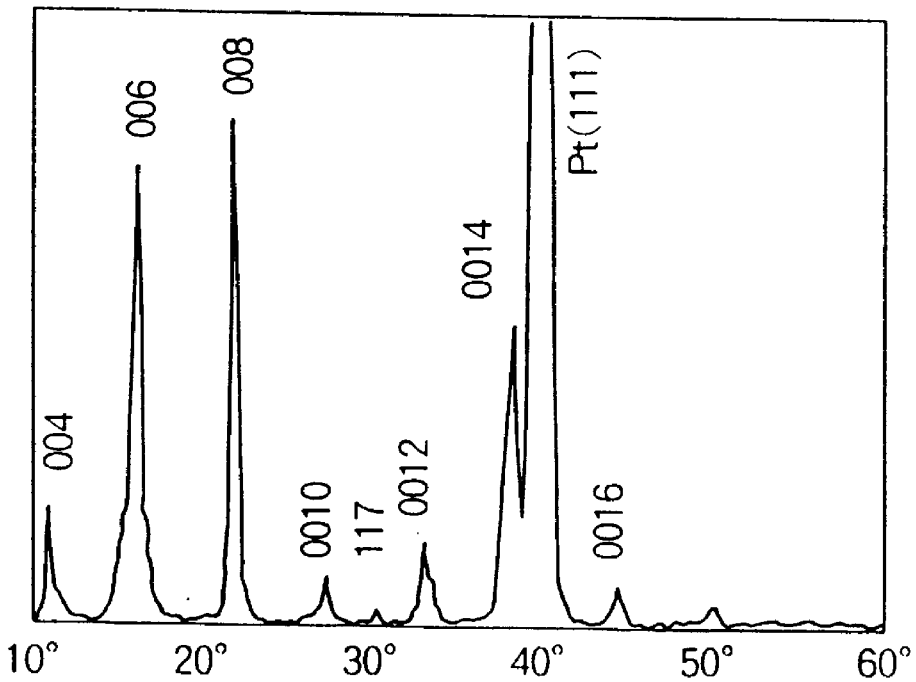

FIGS. 6A and 6B show the observed results under SEM, while FIGS. 7A and 7B show the observed results on X-ray diffractometer. In thin-film forming temperature (substrate temperature) of a growth layer, FIGS. 6A and 7A relate to samples of 450° C. and FIGS. 6B and 7B relate to samples of 500° C.

According to the SEM photos of FIGS. 6A and 6B, it is found that samples exhibit a very dense and smooth thin-film surface morphology with crystalline grains on the order of nm and on the order of 10 nm respectively for FIG. 6A and FIG. 6B. This becomes clear if compared with the result not shown of the control without titanium oxide buffer layer that exhibits a rough uneven surface morphology of platelike coarse crystalline grains ($\mu$m order) formed. It was found from these observed results of surface morphology that the surface morphology of a $Bi_4 Ti_3 O_{12}$ thin-film of ferroelectrics thin-film is evidently affected strongly by that of a $Bi_4 Ti_3 O_{12}$ thin-film of growth layer and forms a nearly equivalent surface morphology.

In addition, as regards crystallinity, it is found from the results of X-ray diffraction in FIGS. 7A and 7B that, as with the thin-film surface morphology, the crystallinity of a $Bi_4 Ti_3 O_{12}$ thin-film of ferroelectrics thin-film is evidently affected strongly by that of a $Bi_4 Ti_3 O_{12}$ thin-film of growth layer and exhibits a nearly equivalent orientation.

Incidentally, this arrangement showed only the results for the thin-film forming temperature of the growth layer of 450° C. and for that of 500° C., but it could be confirmed that the thin-film forming temperature ranging from 400° C. to 650° C. permits a sufficiently smooth and dense crystallinity of growth layer ($Bi_4 Ti_3 O_{12}$ thin-film) to be obtained. Furthermore, at thin-film forming temperature of not lower than 650° C., though the crystallinity is high, the growth of crystalline grains was so much that no smooth-surface growth layer ($Bi_4 Ti_3 O_{12}$ thin-film) could be obtained.

As described above, it was found from these results of SEM and X-ray diffraction observation that a $Bi_4 Ti_3 O_{12}$ of ferroelectrics thin-films according to the present invention exhibits a very dense, smooth and good thin-film surface morphology and forms a random orientation thin-film containing components other than that of the c-axis orientation. Furthermore, it was found that those of 450° C. in the thin-film forming temperature (substrate temperature) of the $Bi_4 Ti_3 O_{12}$ thin-film exhibit a denser and smoother surface morphology than those of 500° C. and are superior in random orientation regarding crystallinity.

Figure 8:
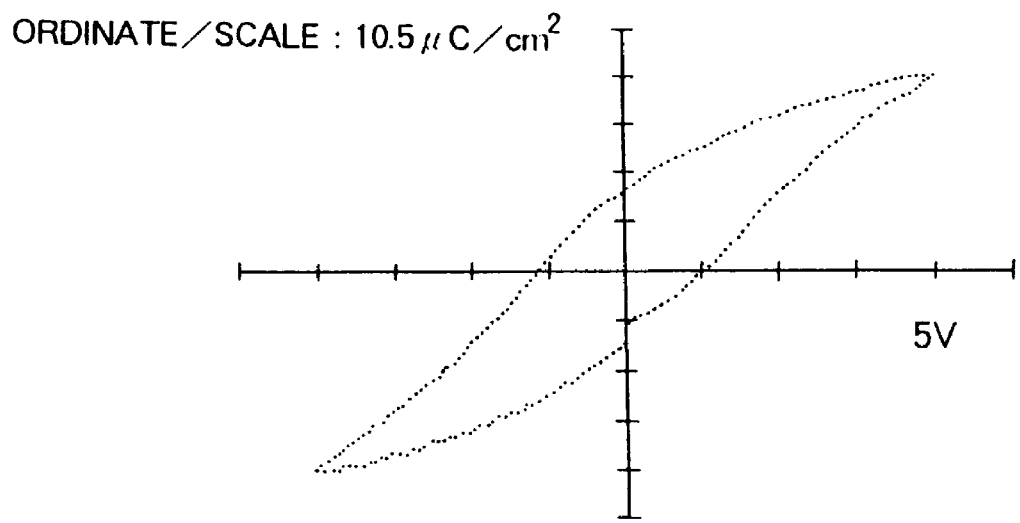
FIG. 8 is a graph showing a ferroelectric hysteresis curve of a first arrangement.

Then, such a capacitor structure as shown in FIG. 1 was constructed by forming an upper electrode layer on the ferroelectrics thin-film ($Bi_4 Ti_3 O_{12}$ thin-film) for two types of samples prepared in this manner and the electric characteristic of this thin-film was estimated, where a 100 μm φ Pt electrode thin-film was formed as this electrode by vacuum deposition process. As a result of estimating ferroelectric characteristic with voltage applied between the lower electrode layer 1 and the upper electrode layer 8 shown in FIG. 1, a sample with the growth layer ($Bi_4 Ti_3 O_{12}$ thin-film) formed at 450° C. exhibits such a ferroelectrics hysteresis curve as shown in FIG. 8. That is, in a sample with the growth layer ($Bi_4 Ti_3 O_{12}$ thin-film) formed at 450° C., the residual spontaneous polarization Pr=16 $\mu C/cm^2$ and reacting electric field Ec=135 kV/cm was obtained under application of 5V. This Pr indicates a by far larger value than the value of Pr=4 $\mu C/cm^2$ in the c-axis direction reported for a $Bi_4 Ti_3 O_{12}$ single crystal.

Since the a-axis value of Pr in $Bi_4 Ti_3 O_{12}$ is known to be larger than the c-axis value and the crystallinity of this arrangement exhibits a random orientation, such large a value of Pr in this arrangement as 16 $\mu C/cm^2$ is attributable to a large contribution of the a-axis oriented component in a $Bi_4 Ti_3 O_{12}$ thin-film.

Figure 9:
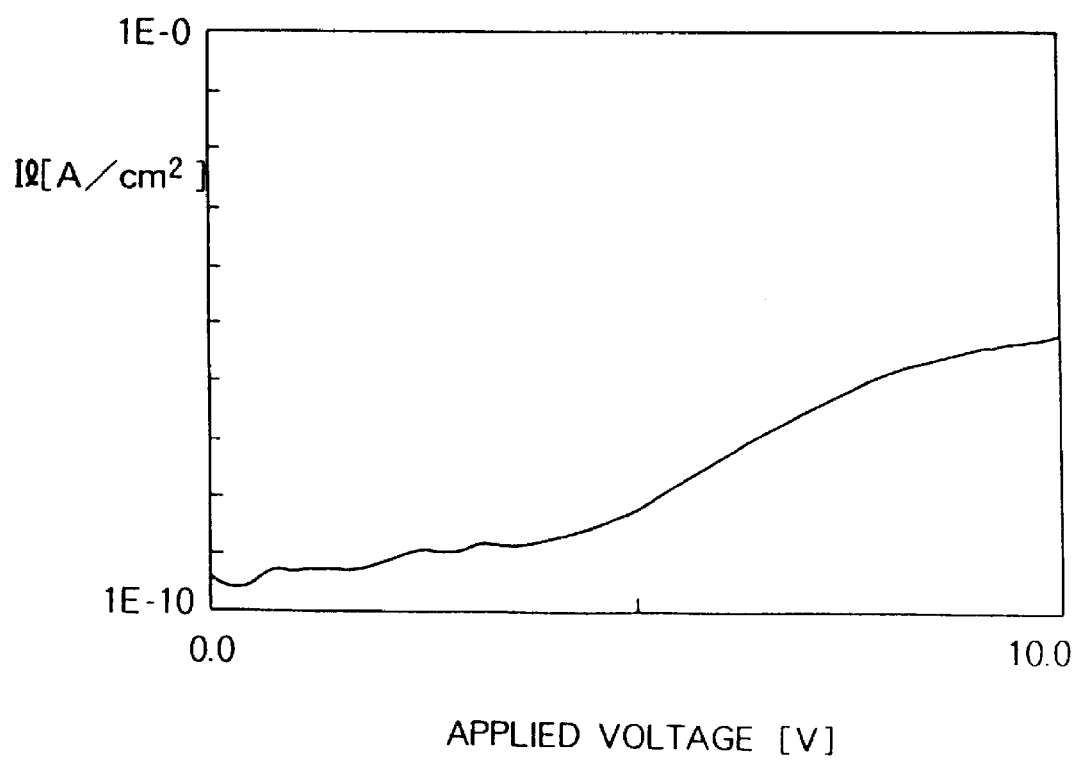
FIG. 9 is a graph showing the applied-voltage dependence of leak current (Il) of a first arrangement.

In this sample, as a result of measuring a leak current Il, the applied voltage dependence is found as shown in FIG. 9 and a small good value of Il=7×10$^{-9}$A/cm$^2$ is obtained at an applied voltage of 5V. The reason for this small leak current can be considered as follows. Since mm-sized platelike coarse crystalline grains (c-plane crystalline grains) as shown in FIG. 3, found in the thin-film surface observation of a control without titanium oxide buffer layer formed, was present in a conventional $Bi_4 Ti_3 O_{12}$ ferroelectrics thin-film, a leak current due to pinholes is apt to occur. In this arrangement, however, since the growth of crystalline grains is suppressed by low-temperature thin-film forming and a thin-film structure composed of fine crystalline grains is formed as shown in FIG. 2, the occurrence of conventional pinholes is suppressed and a low leak current value is considered to be obtained.

Figure 10:
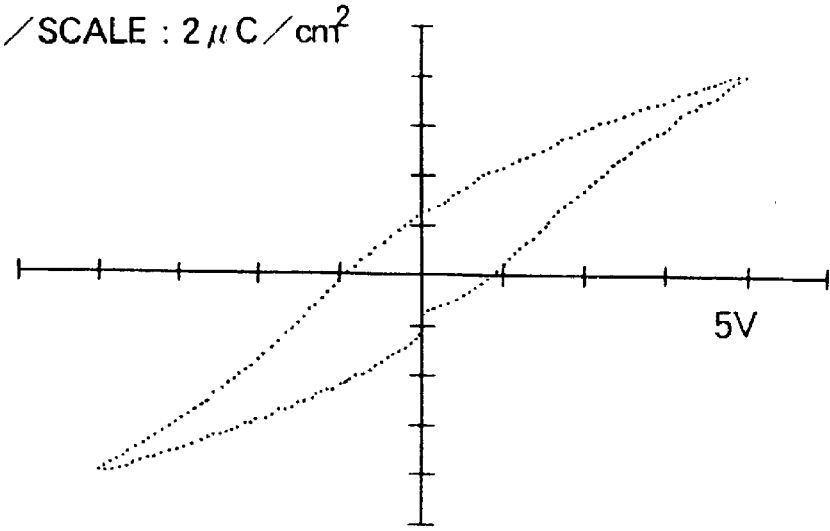
FIG. 10 is a graph showing a ferroelectric hysteresis curve of a first arrangement.

FIG. 10 shows the ferroelectric hysteresis curve of a still another sample of this arrangement, i.e., a sample with the growth layer ($Bi_4 Ti_3 O_{12}$ thin-film) formed at 500° C. As shown in FIG. 10, this sample exhibited a residual spontaneous polarization Pr=2 $\mu C/cm^2$ and a reacting electric field Ec=50 kV/cm. This Pr is smaller than Pr of FIG. 8, and Ec is also smaller than Ec of FIG. 8. This is attributable to a strong c-axis oriented component though the crystallinity of this sample is a random orientation. Such a small value of Ec suggests that the sample is applicable to a device operable at low voltage. Also in this sample, as small good a value of leak current was obtained as Il=1×10$^{-8}$A/cm$^2$.

As described above, it was found that, according to this arrangement, any sample with a $Bi_4 Ti_3 O_{12}$ thin-film of growth layer formed at 450° C. and at 500° C. exhibited a very dense, smooth and good thin-film surface morphology in a $Bi_4 Ti_3 O_{12}$ thin-film of ferroelectrics thin-film and formed a random orientation thin-film containing components other than that of c-axis orientation. Furthermore, a good ferroelectric characteristic is exhibited in any sample, and especially in a sample with the $Bi_4 Ti_3 O_{12}$ thin-film of growth layer formed at 450° C., a very large value of Pr was obtained as seen in Pr=16 $\mu C/cm^2$.

Though this embodiment showed only the result of those whose thin-film forming temperature for the ferroelectrics thin-film film is 400° C., it was found that the ferroelectric thin-film can sufficiently succeed to the crystallinity and the surface morphology of the lower electrode layer if its thin-film forming temperature is 300° C. or higher. However, the case of thin-film forming temperature of 400° C. is superior in ferroelectric characteristic.

Next, a second arrangement, having a thinner $Bi_4 Ti_3 O_{12}$ thin-film of ferroelectrics thin-film than that of the first arrangement, will be described. With this arrangement, the thin-film forming temperature of a $Bi_4 Ti_3 O_{12}$ of growth layer was set at 450° C., a sample having a 40 nm thick $Bi_4 Ti_3 O_{12}$ of ferroelectrics thin-film and having a 50 nm thick composite of titanium oxide buffer layer and growth layer was prepared. Except that the thickness of a $Bi_4 Ti_3 O_{12}$ of ferroelectrics thin-film was set at 40 nm, the preparing method was quite the same as with the first arrangement. At that time, the time taken for the step of forming a $Bi_4 Ti_3 O_{12}$ ferroelectrics thin-film was around 15 min and therefore the time taken for the steps of forming a buffer layer, a growth layer and ferroelectrics layer is approximately 15 min in total.

Figure 11:
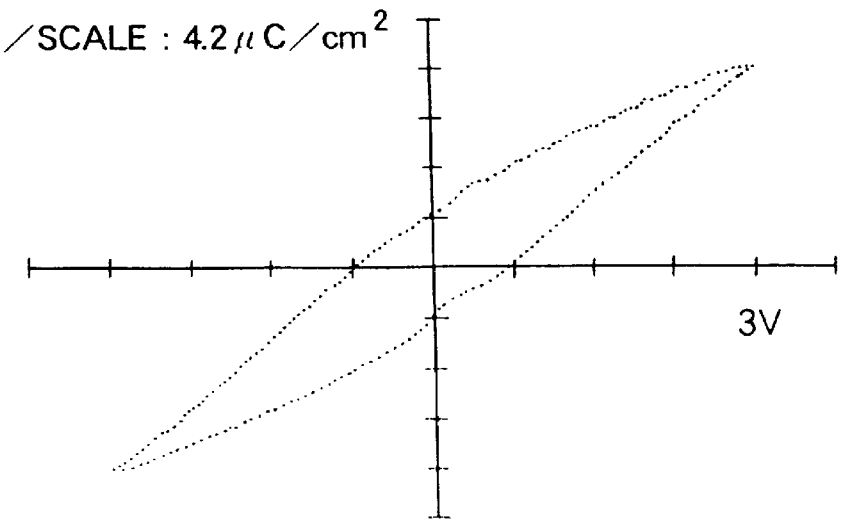
FIG. 11 is a graph showing a ferroelectric hysteresis curve of a second arrangement.

The ferroelectric hysteresis curve of a sample according to this arrangement obtained from a measurement similar to that of the first arrangement is shown in FIG. 11. As clearly seen from FIG. 11, though the ferroelectrics thin-film, 40 nm thick, was very thin, a very good ferroelectric characteristic was obtained as indicated by the residual spontaneous polarization Pr=4.5 μC and the reacting electric field Ec=139 kV for a low applied voltage of 3V. On measuring the leak current, a low value of Il=5×10$^{31\ 6}$ was obtained in spite of as thick a ferroelectrics thin-film as 40 nm.

Figure 12:
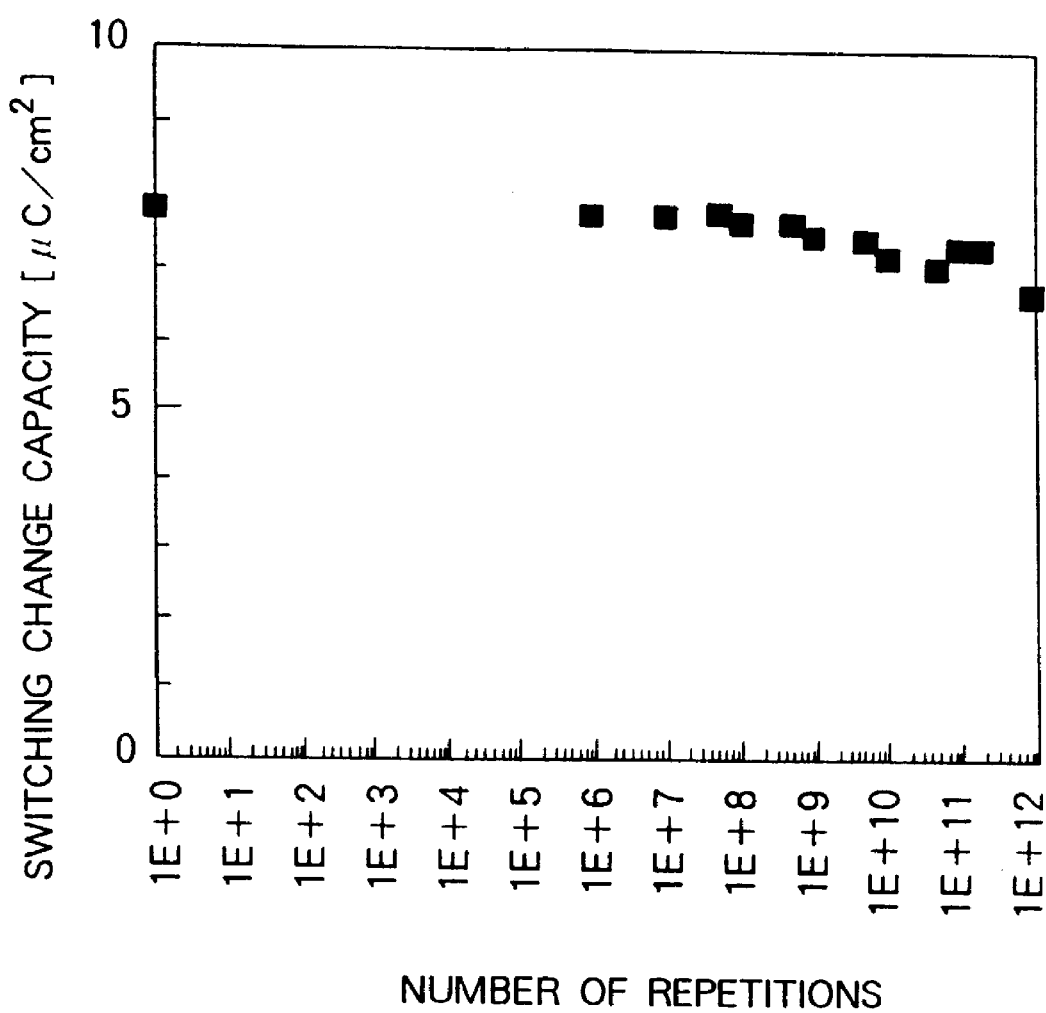
FIG. 12 is a graph showing the repetition times dependence of switching charge quantity of a second arrangement.

Furthermore, the repetitive fatigue for polarization inversion was measured on a sample according to this arrangement. The test conditions are that, when repeatedly applying a pair of bipolar pulses at an applied voltage of 3V and in a pulse width of 100 ns, the changing rate of switching charge quantity (difference between the inversion charge quantity and the non-inversion charge quantity of polarization) is measured. The results are shown in FIG. 12. As shown in FIG. 12, a decrease in switching charge quantity is about 13% after 1×10$^{12}$ times of repetitions and accordingly the fatigue resistance of this arrangement is clearly by far superior since that of a conventional PZT material is at most on the order of 10$^8$.

Figure 13:
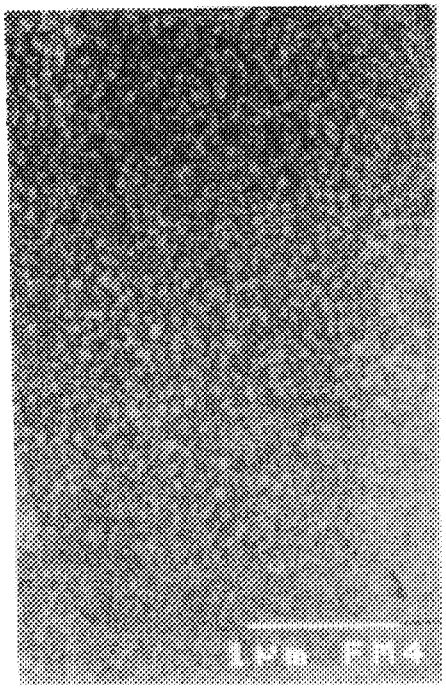
FIG. 13 is a photograph showing the SEM observed result of the surface of a second embodiment of $Bi_4 Ti_3 O_{12}$ ferroelectrics thin-film.

FIG. 13 shows the observed results of thin-film surface morphology under SEM in this arrangement. Since the thin-film is thin, this sample comprises fine crystalline grains on the order of nm and a good characteristic of very dense and smooth thin-film was found to be obtained.

A third arrangement with heat treatment applied to a sample prepared according to the second arrangement will be described. As conditions for heat treatment, the RTA (Rapid Thermal Annealing), high-speed heat treatment by infrared irradiation, was applied at a heat treatment temperature of 650° C. in oxygen gas flow and the ferroelectric characteristic was examined for different periods of treatment time of 2 min, 10 min and 30 min. As a result, the residual spontaneous polarization Pr was Pr=4.8 $\mu$C/cm for 2 min treatment time, Pr=5.9 $\mu$C/cm for 10 min treatment time and Pr=7.1 $\mu$C/cm for 30 min. With longer RTA treatment time Pr is remarkably improved.

Figure 14:
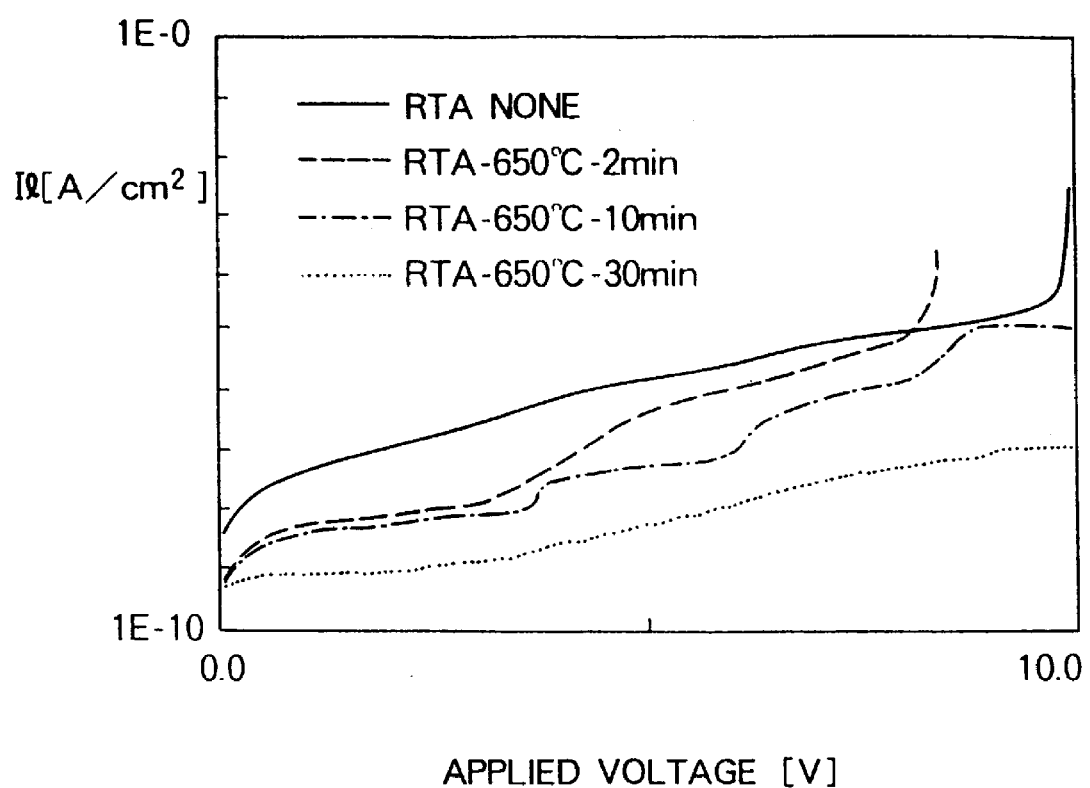
FIG. 14 is a graph showing the applied-voltage dependence of leak current (Il) of a third arrangement.

Furthermore, leak current Il varies depending on applied voltage as shown in FIG. 14. When 3V is applied, Il was Il=8×10$^{-8}$ A/cm$^2$ for 2 min treatment time, Il=2×10$^{-8}$ A/cm$^2$ for 10 min treatment time and Il=2×10$^{-9}$ A/cm$^2$ for 30 min treatment time. With longer RTA treatment time, Il was markedly improved. This is attributable to an improvement in the crystallinity of a $Bi_4 Ti_3 O_{12}$ of ferroelectrics thin-film due to heat treatment in this arrangement.

As a fourth arrangement, a sample having a 190 nm thick $Bi_4 Ti_3 O_{12}$ ferroelectrics thin-film and having a 200 nm composite of titanium oxide buffer layer and growth layer ($Bi_4 Ti_3 O_{12}$) was prepared. Except that the thin-film forming temperature of a growth layer ($Bi_4 Ti_3 O_{12}$ thin-film) was set at 450° C., the preparing method was quite the same as that of the first and second arrangement. At that time, the time taken for the step of forming a $Bi_4 Ti_3 O_{12}$ ferroelectrics thin-film was on the order of 60 min and therefore the time taken for the steps of forming a buffer layer, a growth layer and ferroelectrics layer is approximately on the order of an hour in total.

Figure 15:
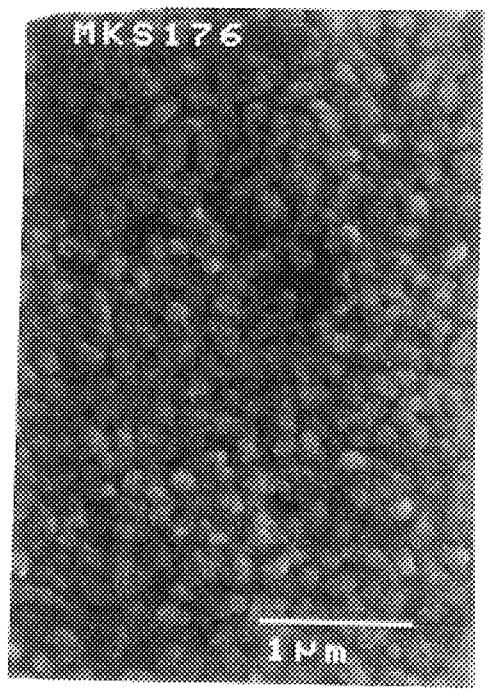
FIG. 15 is a photograph showing the SEM observed result of the surface of a fourth arrangement of $Bi_4 Ti_3 O_{12}$ ferroelectrics thin-film.

FIG. 15 shows the result of SEM observation of thin-film surface morphology in this arrangement. As clearly seen from the SEM photo of FIG. 15, a very dense, smooth and good thin-film surface morphology on the order of 10 nm is exhibited. Although the thin-film thickness was nearly double that of the first arrangement, the surface morphology of the $Bi_4 Ti_3 O_{12}$ ferroelectrics thin-film is found to be strongly affected by the growth layer ($Bi_4 Ti_3 O_{12}$ thin-film).

Figure 16:
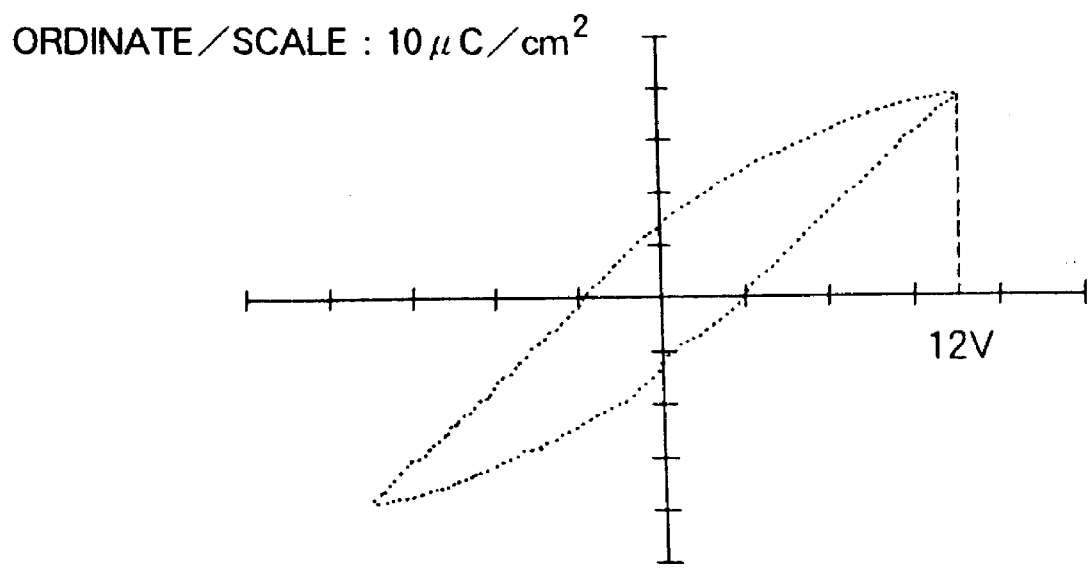
FIG. 16 is a graph showing a ferroelectric hysteresis curve of a fourth arrangement.

FIG. 16 shows the ferroelectric hysteresis curve of a sample according to this arrangement, measured as with the above arrangements. As shown in FIG. 16, the residual spontaneous polarization and the resisting electric field are obtained as Pr=14 $\mu$C/cm$^2$ and Ec=180 kV/cm in this arrangement. Still in this arrangement, since the $Bi_4 Ti_3 O_{12}$ ferroelectrics thin-film forms a random orientation thin-film and the a-axis component largely contributes, Pr is considered to exhibit a by far larger value than a value of Pr=4 $\mu$C/cm$^2$ reported in the c-axis direction of a $Bi_4 Ti_3 O_{12}$ single crystal. Also in this sample, a small value of Il=3× 10$^{-9}$A/cm$^2$ was obtained as the leak current. In this manner, according to this arrangement, the present invention could be confirmed to be effective for as thick a ferroelectrics thin-film as 200 nm.

With this arrangement, the thickness was set at 5 nm for any of titanium oxide layer and growth layer ($Bi_4 Ti_3 O_{12}$ thin-film) but the present invention was significantly obtained even if the thickness of either layer is within the range of 3 nm to 10 nm. In addition, this arrangement employed a Pt lower electrode layer/Ta adhesive layer/SiO$_2$ insulating layer/Si substrate as the substrate, but, in spite of a former report that the pyrochlore phase of $Bi_4 Ti_3 O_{12}$ was apt to occur when a $Bi_2 Ti_2 O_7$ thin-film is formed on a similar substrate by low-temperature forming through aids of the MOCVD process, it was proved that no pyrochlore phase of $Bi_2 Ti_2 O_7$ occurs in this arrangement and the present invention is not limited to such a substrate structure.

Figure 17:
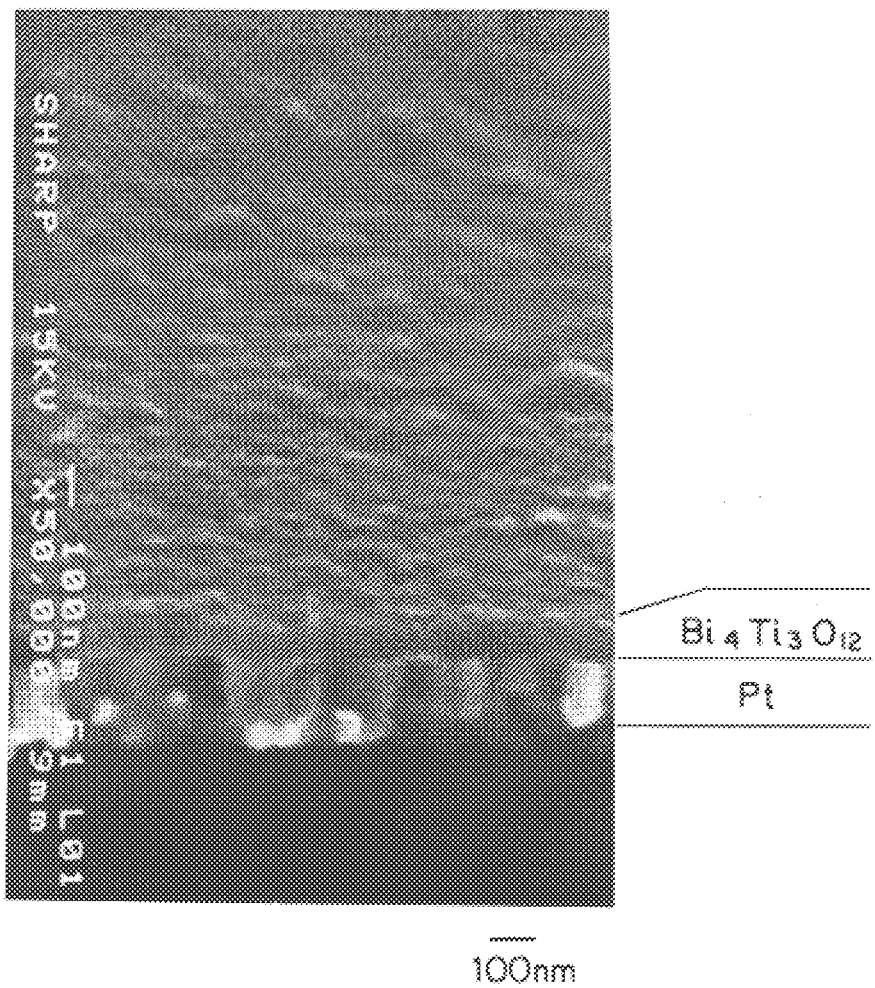
FIG. 17 is a photograph showing the SEM perspective observation result of the surface of a fifth arrangement of $Bi_4 Ti_3 O_{12}$ ferroelectrics thin-film.
Figure 18:
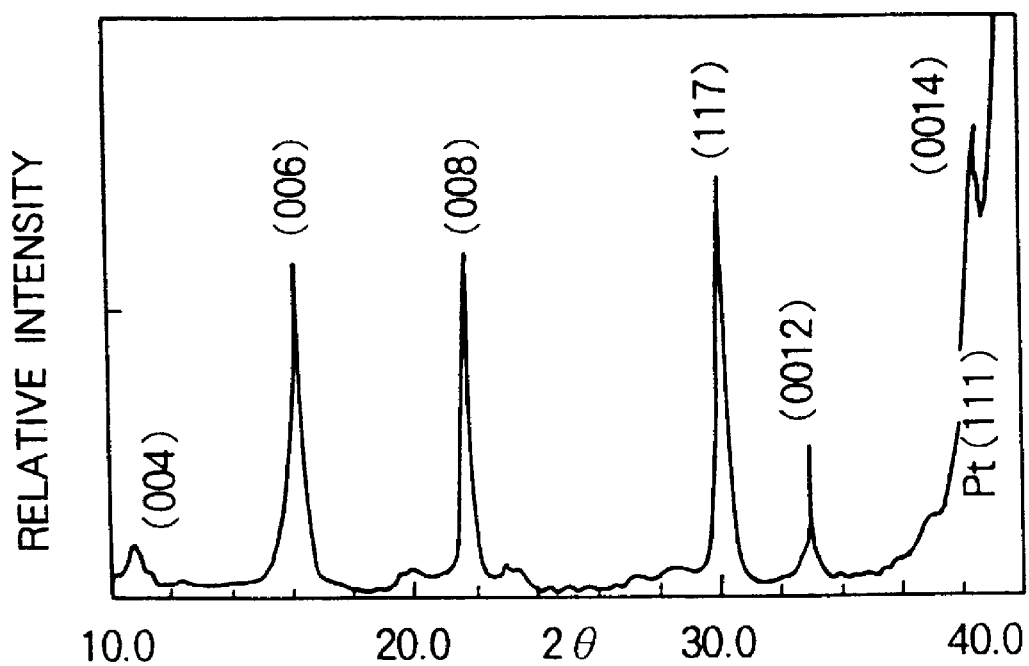
FIG. 18 is a graph showing the X-ray diffraction observed result of the crystallinity of a fifth arrangement of $Bi_4 Ti_3 O_{12}$ ferroelectrics thin-film.

A fifth arrangement will be described hereinafter. First, after forming a 5 nm thick first buffer layer of titanium oxide by supplying a titanium raw material alone at a substrate temperature of 400° C., a 3 nm thick $Bi_4 Ti_3 O_{12}$ growth layer was formed subsequently by simultaneously supplying a Bi raw material, a Ti raw material and O$_2$ gas at a substrate temperature of 650° C. Here, after setting the substrate temperature to 400° C. anew, a $Bi_4 Ti_3 O_{12}$ thin-film, 100 nm in total thickness, was prepared by simultaneously supplying a Bi raw material, a Ti raw material and O$_2$ gas again under the same conditions and in the same quantity as with the forming of the $Bi_4 Ti_3 O_{12}$. FIGS. 17 and 18 show the surface morphology and sectional shape of this $Bi_4 Ti_3 O_{12}$ thin-film by perspective SEM photography and the X-ray diffraction pattern of this $Bi_4 Ti_3 O_{12}$ thin-film.

It is found from FIGS. 17 and 18 that a thin-film according to the fifth arrangement is a good crystallinity $Bi_4 Ti_3 O_{12}$ thin-film, so-called random orientation thin-film comprising the c-axis (00n) and (117) oriented components and a dense and smooth thin-film. On comparing the intensity ratio of c-axis (00n) to (117) diffraction peaks in FIG. 18 with those of FIGS. 7A and 7B in the first arrangement, the peak intensity ratio of this arrangement was proved to be situated just between that of FIG. 7A and that of FIG. 7B. From this it is considered that the orientation state of a $Bi_4 Ti_3 O_{12}$ according to this arrangement is an intermediate state between that shown in FIG. 7A and that shown in FIG. 7B.

Figure 19:
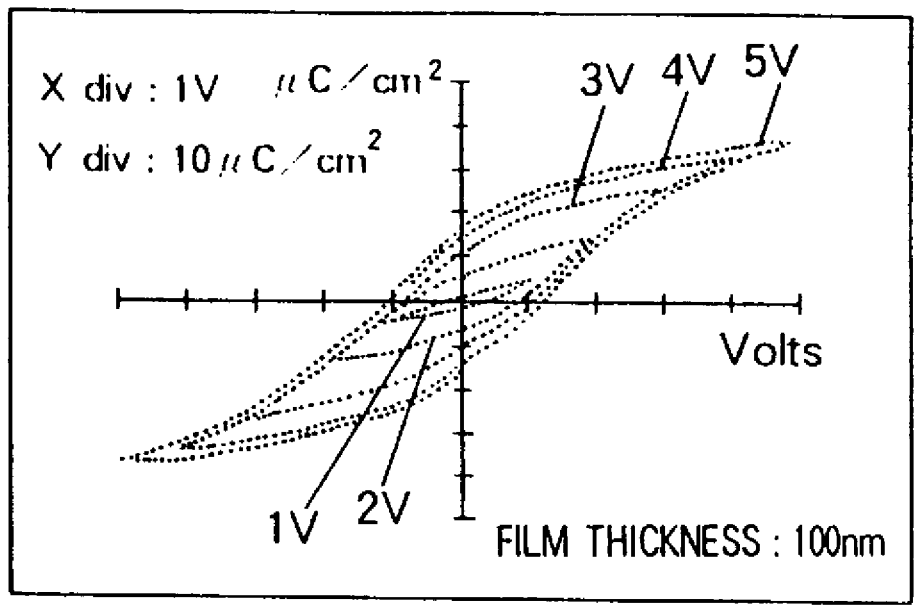
FIG. 19 is a graph showing a ferroelectric hysteresis curve of a fifth arrangement.
Figure 20:
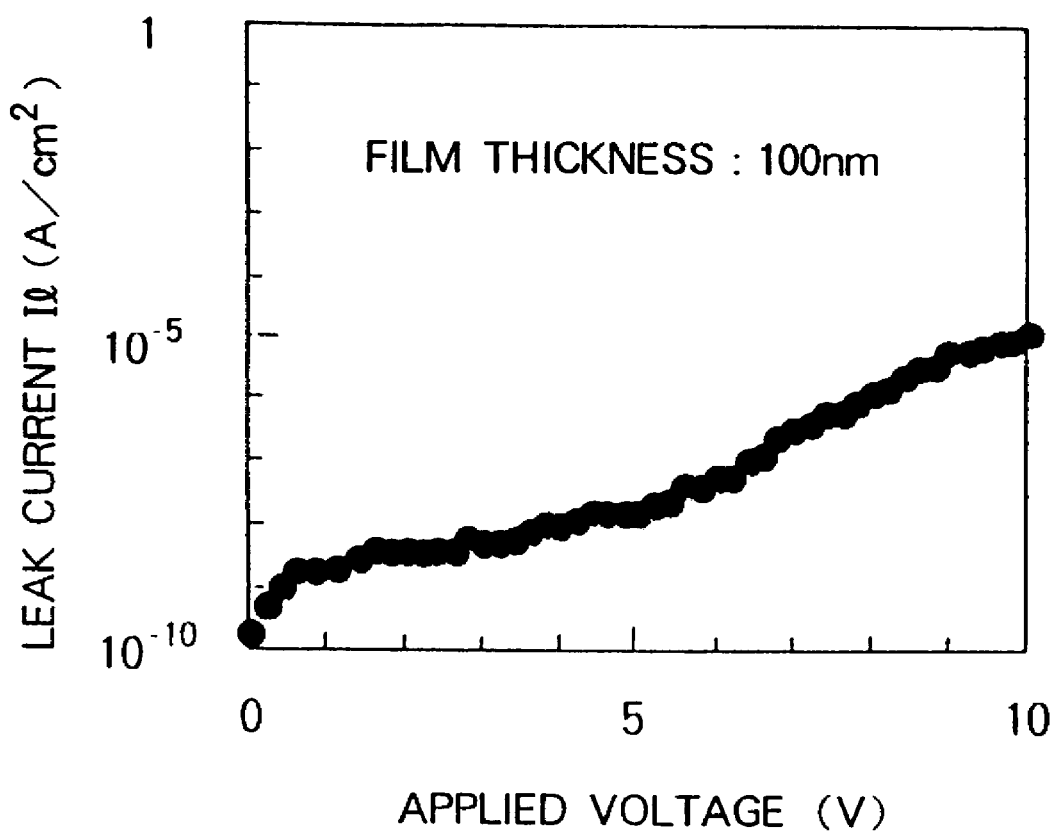
FIG. 20 is a graph showing the applied-voltage dependence of leak current (Il) of a fifth arrangement.

For a capacitor formed by evaporating a 100 $\mu$m $\phi$ Pt electrode onto the $Bi_4 Ti_3 O_{12}$ mentioned above, measurements were made of ferroelectric characteristic, a distinct hysteresis curve as shown in FIG. 19 was obtained, and further the residual spontaneous polarization Pr=11 $\mu$C/cm$^2$ and reacting electric field Ec=90 kV/cm for applied voltage of 3V and the residual spontaneous polarization Pr=15.5 $\mu$C/cm$^2$ and reacting electric field Ec=120 kV/cm for applied voltage of 5V were also obtained. In addition, from the leak current characteristic shown in FIG. 20, very small values of leak current are seen to be Il=7×10$^{-9}$ kV/cm$^2$ for applied voltage of 3V and Il=4×10$^{-8}$ kV/cm$^2$ for applied voltage of 5V.

Figure 21:
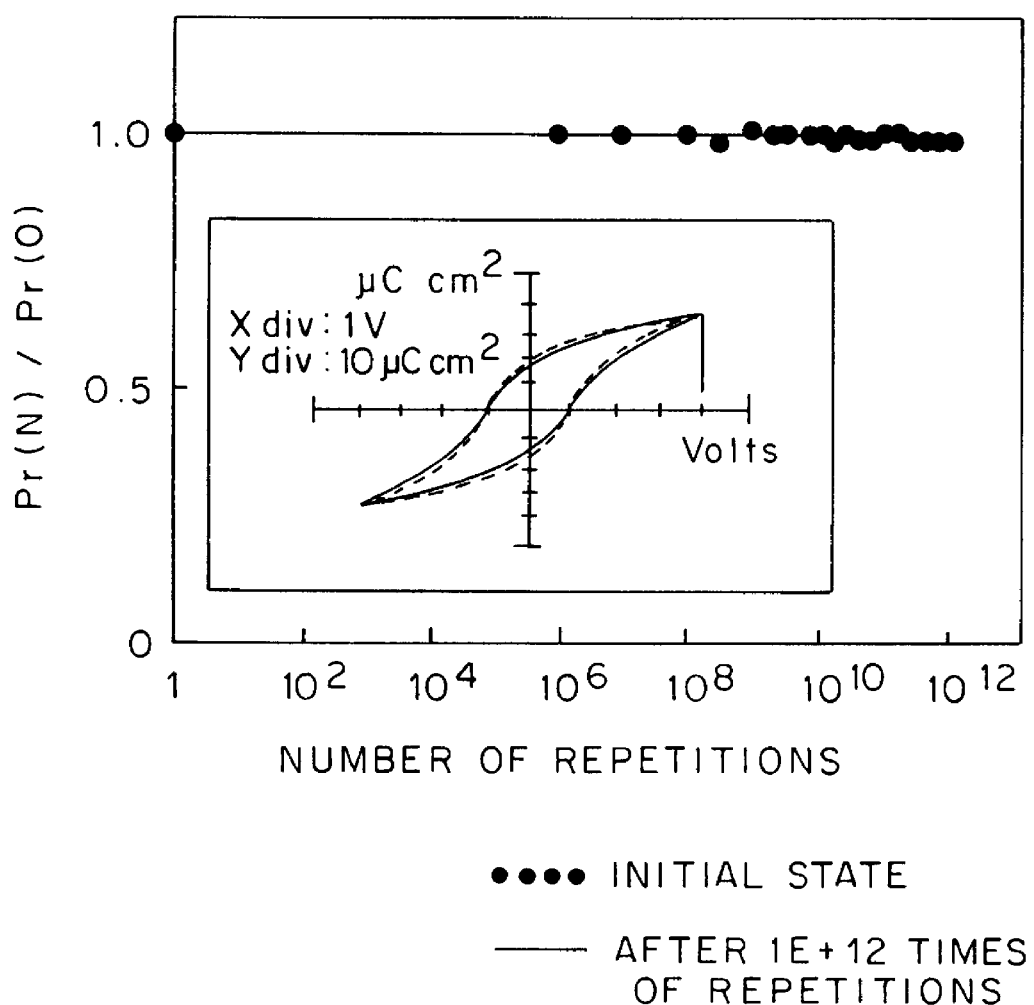
FIG. 21 is a graph showing the repetition times dependence of switching charge quantity and the comparison of ferroelectric hysteresis curves before and after the repetition ($10^{12}$ cycles) of a fifth arrangement.

Furthermore, the measured result of fatigue resistance in the relevant $Bi_4 Ti_3 O_{12}$ thin-film is shown in FIG. 21. When repeatedly applying a pair of bipolar pulses at an applied voltage of 4V in a pulse width of 500 ns, a change in residual polarization was such a degree that about 3.2% decrease of Pr was noticed after 1×10$^{12}$ times of repetitions and accordingly the fatigue characteristic of ferroelectric thin-films obtained by the present invention is proved to be extremely excellent as compared with a conventional PZT material (the fatigue resistance limit is below 10$^8$ times).

Figure 22:
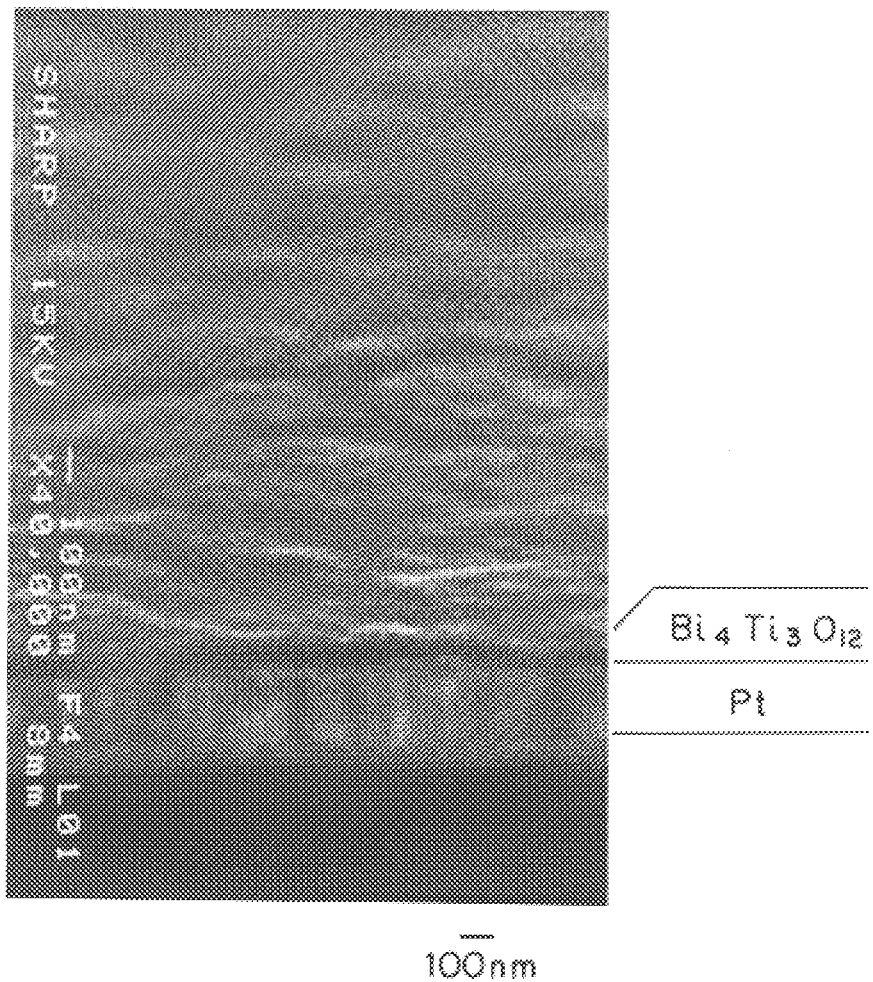
FIG. 22 is a photograph showing the SEM perspective observation result of the surface of a sixth arrangement of $Bi_4 Ti_3 O_{12}$ ferroelectrics thin-film.
Figure 23:
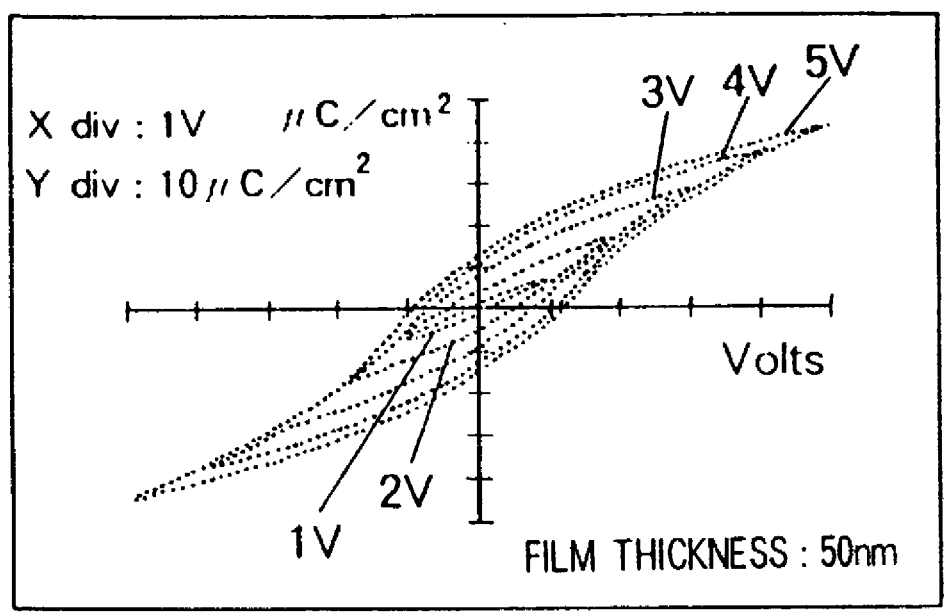
FIG. 23 is a graph showing a ferroelectric hysteresis curve of a sixth arrangement.

A sixth arrangement will be described hereinafter. After preparing a first buffer layer of titanium oxide and a $Bi_4 Ti_3 O_{12}$ growth layer under the same conditions as with the fifth arrangement and then setting the substrate temperature at 400° C. anew, a $Bi_4 Ti_3 O_{12}$ ferroelectrics thin-film was formed so as to obtain a total thickness of 50 nm. FIG. 22 shows the surface morphology and sectional shape of this-time $Bi_4 Ti_3 O_{12}$ thin-film by perspective SEM photography. As with the fifth arrangement mentioned above, a dense, smooth-surface, good crystallinity and random orientation $Bi_4 Ti_3 O_{12}$ thin-film was obtained. For a capacitor formed by evaporating a 100 $\mu$m $\phi$ Pt electrode onto the $Bi_4 Ti_3 O_{12}$ mentioned above, measurements were made of ferroelectric characteristic, a distinct hysteresis curve as shown in FIG. 23 was obtained, and further the residual spontaneous polarization Pr=9 $\mu$C/cm$^2$ and reacting electric field Ec=120 kV/cm for applied voltage of 3V and the residual spontaneous polarization Pr=14 $\mu$C/cm$^2$ and reacting electric field Ec=180 kV/cm for applied voltage of 5V were also obtained.

According to the present invention, a sufficient ferroelectric characteristic can be effectively drawn out by using a very thin-film as 50 nm thick thin-film, which is the most important merit also in application to a large capacity FRAM or the like.

Figure 24:
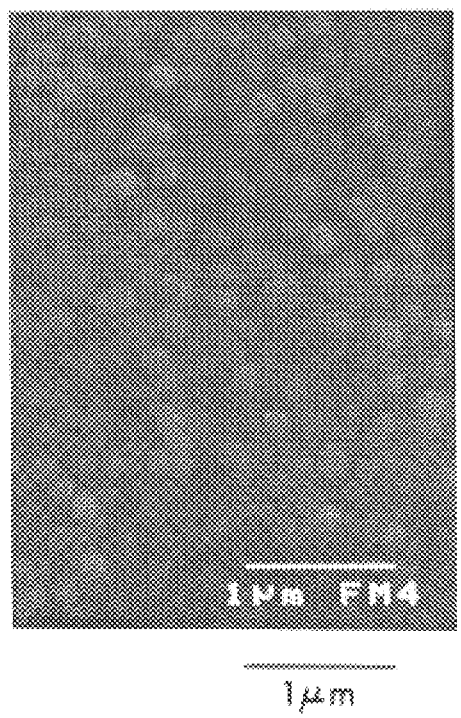
FIG. 24 is a photograph showing the SEM perspective observation result of the surface of a seventh arrangement of $Bi_4 Ti_3 O_{12}$ ferroelectrics thin-film.
Figure 25:
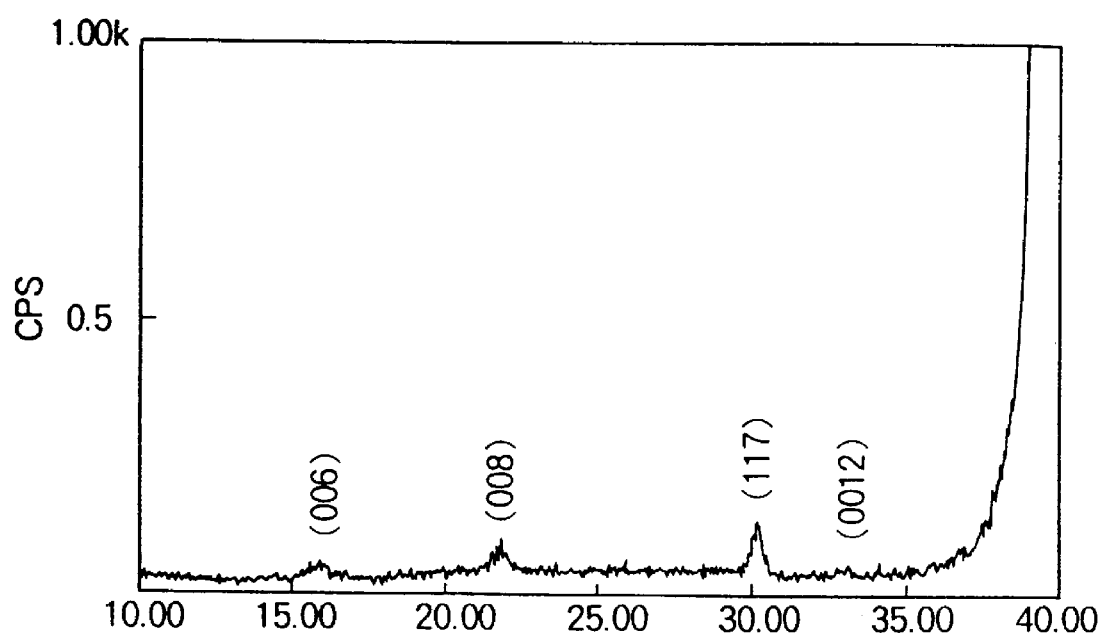
FIG. 25 is a graph showing the X-ray diffraction observed result of the crystallinity of a seventh arrangement of $Bi_4 Ti_3 O_{12}$ ferroelectrics thin-film.

A seventh arrangement will be described hereinafter. First, after forming a 5 nm thick first buffer layer of titanium oxide by supplying a titanium raw material alone at a substrate temperature of 400° C., a 5 nm thick $Bi_4 Ti_3 O_{12}$ growth layer was formed subsequently by simultaneously supplying a Bi raw material, a Ti raw material and $O_2$ gas at a substrate temperature of 450° C. Here, after setting the substrate temperature to 300° C. anew, a $Bi_4 Ti_3 O_{12}$ thin-film, 100 nm in total thickness, was prepared by simultaneously supplying a Bi raw material, a Ti raw material and $O_2$ gas again under the same conditions and in the same quantity as with the forming of the $Bi_4 Ti_3 O_{12}$. FIGS. 24 and 25 show the surface morphology and sectional shape of this $Bi_4 Ti_3 O_{12}$ thin-film by perspective SEM photography and the X-ray diffraction pattern of this $Bi_4 Ti_3 O_{12}$ thin-film.

It is found from FIGS. 24 and 25 that a thin-film according to the fifth arrangement is a good crystallinity $Bi_4 Ti_3 O_{12}$ thin-film, so-called random orientation thin-film comprising the c-axis (00n) and (117) oriented components and a dense and smooth thin-film. Although the crystallinity was no so good, use of the present invention enables a $Bi_4 Ti_3 O_{12}$ thin-film to be grown even at very low substrate temperature of 300° C.

In a production method according to the present invention, a ferroelectrics thin-film ($Bi_4 Ti_3 O_{12}$ thin-film) exhibiting a good ferroelectric characteristic was obtained at a thin-film forming temperature ranging from 400° C. to 650° C. for a titanium oxide buffer layer and a growth layer ($Bi_4 Ti_3 O_{12}$ thin-film) by the MOCVD process. Especially in the temperature range of 400° C. to 470° C., a ferroelectrics thin-film ($Bi_4 Ti_3 O_{12}$ thin-film) having a strong c-axis orientation and exhibiting a large residual spontaneous polarization Pr was obtained. And, a good ferroelectric characteristic was exhibited at a thin-film forming of a ferroelectrics thin-film ($Bi_4 Ti_3 O_{12}$ thin-film) by the MOCVD process within the temperature range of 300° C. to 400° C. The heat treatment in a production method according to the present invention exhibits a significant effect in the temperature range of 500° C. to 700° C. and a sufficient effect can be obtained for a short period of time even at temperatures around 700° C., so that the present invention is sufficiently applicable also to a highly integrated device.

Incidentally, among the conditions for thin-film forming by the MOCVD process, conditions of materials, supplied gas or the like except the thin-film forming temperature (substrate temperature) are not limited to those of the arrangements mentioned above but are appropriately set dependently on a thin-film forming device, supplied gas and the like.

In the first to fourth arrangements mentioned above, the thin-film forming temperature of a titanium oxide buffer layer is set equal to that of a $Bi_4 Ti_3 O_{12}$ of growth layer considering the productivity, because a change in substrate temperature lengthens the manufacturing time of a device in actual manufacturing steps. On the other hand, as shown in the fifth to seventh arrangements, the thin-film forming temperature of a titanium oxide buffer layer may be set different from that of a $Bi_4 Ti_3 O_{12}$ of growth layer.

Figure 26A:
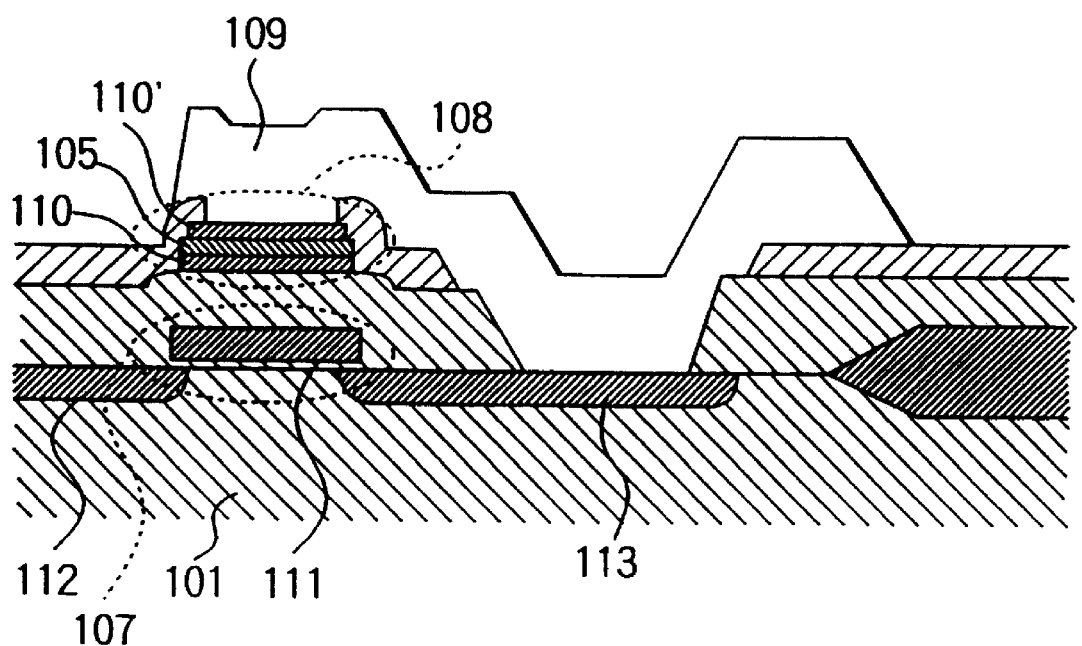
FIGS. 26A and 26B are schematic views showing the sectional structure and an equivalent circuit diagram of capacitor-structured nonvolatile memory using a $Bi_4 Ti_3 O_{12}$ ferroelectrics thin-film according to the present invention.
Figure 26B:
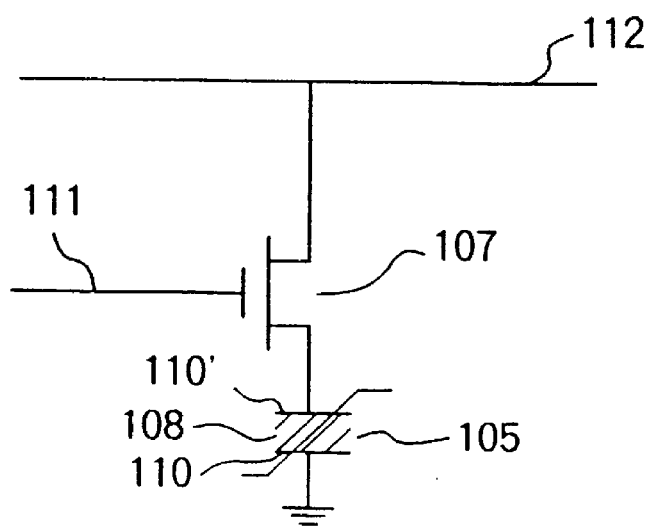

Hereinafter, arrangements wherein to various electronic elements is made use of the $Bi_4 Ti_3 O_{12}$ ferroelectric thin-film mentioned above will be described. First, FIGS. 26A and 26B show an arrangement wherein to a nonvolatile memory of capacitor structure is made use of the $Bi_4 Ti_3 O_{12}$ ferroelectric thin-film mentioned above and the equivalent circuit thereof, respectively.

A nonvolatile memory of capacitor structure to which use is made of the ferroelectrics thin-films shown in these arrangements comprises a capacitor 108 and a transistor 107. Here, a capacitor 108 comprises a <117> oriented $Bi_4 Ti_3 O_{12}$ thin-film 5 and a pair of conductors (electrodes) 110 and 110' sandwiching, while a transistor 107 comprises a bit line 112, a word line 111 and a signal line 113 connected to an AI electrode 109. Incidentally, the AI electrode 109 is connected also to the electrode 110' of the capacitor 108.

A method for producing aforesaid capacitor-structured nonvolatile memory will be described. First, after forming $SiO_2$ and $Si_3N_4$ on an n-type Si substrate, photo-etching is conducted in such a manner that $Si_3N_4$ remains at the site on which to form a transistor and field oxidation is effected to form a field $SiO_2$. Next, after removing the $Si_3N_4$ thin-film formed lately and the $SiO_2$ thin-film directly therebeneath and forming a gate $SiO_2$ with the gate oxide thin-film, Poly-Si gate 111 is formed. Next, a source 112 and a drain 113 are formed by ion implantation with this gate 111 used as a mask, then covering these structures with PSG (silicon phosphate glass) as the interlayer insulating thin-film and making the whole surface even by reflow.

After forming an electrode 110 thereon, a <117> oriented $Bi_4 Ti_3 O_{12}$ thin-film 105 and an electrode 110' are formed in sequence. Then, after forming the structures with PSG again and effecting a reflow, contact holes are formed on the electrode 110' and the drain 113 by etching and finally an AI electrode 109 for wiring is provided.

Incidentally, the <117> oriented $Bi_4 Ti_3 O_{12}$ thin-film 105 mentioned here is that formed at a thin-film forming temperature of 450° C. in the first arrangement mentioned above. Actually, the <117> oriented $Bi_4 Ti_3 O_{12}$ thin-film 105 was formed after forming the titanium oxide buffer layer and the growth layer, not shown in FIG. 26A, on the electrode 110 under conditions similar to those of the first arrangement. In addition, the reason for using a <117> oriented $Bi_4 Ti_3 O_{12}$ thin-film as the ferroelectrics thin-film is that a thin-film exhibiting a large residual spontaneous polarization is preferable for such an element as this arrangement.

Hereinafter, the operation of the aforesaid capacitor-structured nonvolatile memory will be described. In the case of writing the information "1", on applying a negative pulse more intense than the reacting electric field is applied from the bit line 112 through the transistor 107 to the ferroelectrics thin-film 105. The ferroelectrics thin-film 105 is polarized and a negative residual polarization charge is stored on the side of the electrode 110 of the capacitor 108. On the other hand, in the case of writing the information "0", on applying a positive pulse more intense than the reacting electric field from the bit line 112 through the transistor 107 to the ferroelectrics thin-film 105, the ferroelectrics thin-film 105 is polarized and a positive residual polarization charge is stored on the side of the electrode 110 of the capacitor 108.

In the case of reading out the information "1", on applying a positive pulse to the ferroelectrics thin-film 105, a negative residual polarization makes a polarization inversion in turn and a positive residual polarization is stored on the side of the electrode 110 of the capacitor 108. Thus, before and after the application of a pulse, a change equal to the difference between the positive residual polarization and the negative positive residual polarization takes place in charge quantity. On the contrary, in the case of reading out the information "0", hardly any change in charge quantity takes place before and after the application of a pulse, because no polarization inversion is caused even by applying a positive pulse. By using a sense amplifier, this difference in charge quantity is identified as bit information. Since the ferroelectric thin-film 105 has a residual polarization, the state of "1" or "0" is maintained even after turning the power supply to OFF and the nonvolatile storing operation is implemented. Incidentally, in a similar structure, this memory device is allowed to operate normally as a DRAM and as a nonvolatile memory only at the OFF period of power supply.

Thus, when applying the present invention to the ferroelectrics thin-film of a capacitor-structured nonvolatile memory, a sufficient characteristic was obtained as the nonvolatile memory.

Figure 27:
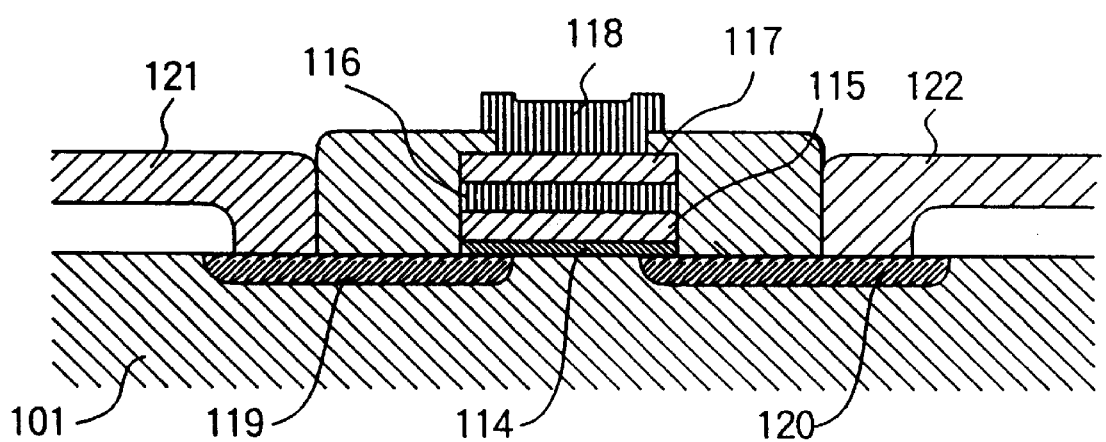
FIG. 27 is a schematic view showing the sectional structure of MFMIS-FET using a $Bi_4 Ti_3 O_{12}$ ferroelectrics thin-film according to the present invention.

Hereinafter, an arrangement wherein to MFMIS-FET (Metal Ferroelectric Metal Insulator Semiconductor-Field Effect Transistor) is made use of the $Bi_4 Ti_3 O_{12}$ ferroelectric thin-film mentioned above will be described referring to FIG. 27. FIG. 27 shows a sectional structural schematic illustration of this arrangement. First, after forming a gate $SiO_2$ 114 on an n-type Si substrate 101 by the thermal oxidation process and forming a floating gate 115 thereon with Pt, a drain 119 and a source 120 are formed by ion planting, then covering these structures with PSG (silicon phosphate glass) and making the whole surface even by reflow.

Next, the PSG on the PPt gate 115 is removed by etching, a c-axis oriented $Bi_4 Ti_3 O_{12}$ ferroelectrics thin-film 116 is formed thereon and further a control gate 117 is formed with Pt. Then, after covering these structures with PSG again and effecting a reflow, contact holes are formed on the control gate 117, the drain 119 and the source 120 and finally Al electrodes 118, 121 and 122 for wiring are provided. Incidentally, the c-axis oriented $Bi_4 Ti_3 O_{12}$ thin-film 116 mentioned here is that formed at a thin-film forming temperature of 500° C. for the titanium oxide and the growth layer in the first arrangement mentioned above. Actually, a c-axis oriented $Bi_4 Ti_3 O_{12}$ thin-film 116 was formed after forming the titanium oxide buffer layer and the growth layer not shown in FIG. 27 under conditions similar to those of the first arrangement. In addition, since it is desirable for such an MFMIS-FET-structured element as this arrangement to be controllable at a low voltage, a c-axis oriented $Bi_4 Ti_3 O_{12}$ thin-film is employed as the ferroelectrics thin-film.

With the MFMIS-FET, on changing the polarization direction of the aforesaid ferroelectrics thin-film by voltage application to the control gate 117, the $SiO_2$ 114 of gate insulating is dielectrically polarized via the floating gate 115 by its electrostatic induction and the direction of polarization changes. Since the formation of a channel on the semiconductor surface directly beneath the gate can be controlled by this direction of polarization, "0" and "1", can be defined by the ON-OFF of drain current. That is, assume that, at the zero bias state of the gate electrode, the ferroelectric thin-film 116 is so polarized in the direction of the semiconductor substrate that the side of the floating gate 115 becomes negative. In this case, the $SiO_2$ 114 is dielectrically polarized, its surface in contact with the Si substrate 101 becomes positive, so that the drain 119 and the source 120 are disconnected (OFF state).

Next, on applying a larger positive voltage than the reacting electric field of the ferroelectric thin-films 116 to the gate electrode 117, the ferroelectrics thin-film 116 inverts the polarization direction and is so polarized that the side of the floating gate 115 becomes positive. In this case, the $SiO_2$ 114 is dielectrically polarized and its surface in contact with the Si substrate 101 becomes positive, whereas the surface of the Si substrate 101 in contact with the $SiO_2$ 114 becomes negative, so that the drain 119 and the source 120 is connected (ON state). In this state, even when making the gate voltage into a zero bias state, this ON state is maintained by the residual polarization.

Since this dielectric polarization of the $SiO_2$ 114 remains so long as the polarization of the ferroelectrics thin-film 116 is maintained, this arrangement can operate as a nonvolatile memory allowing a nondestructive readout.

As described above, when applying the present invention to the ferroelectrics thin-film of an MFMIS-FET-structured nonvolatile memory, a sufficient characteristic was obtained as the nonvolatile memory.

As described above, according to a ferroelectrics thin-film coated substrate according to the present invention, a quite excellent ferroelectric characteristic is obtained in a large value of residual spontaneous polarization and a high reliability can be implemented in excellent leak current characteristic and fatigue resistance. In particular, a very large value of 16 $\mu C/cm^2$ in residual spontaneous polarization can be obtained and a sufficient ferroelectric characteristic can be obtained even for a approx. 50 nm thick thin-film. This advantage enables a sufficient polarization charge to be ensured even when forming a infinitesimal-sized capacitor and accordingly is effective for application to a highly integrated device. And, since a very dense and smooth thin-film morphology is obtained, various fine machining processes can be coped with and therefore this advantage is also effective for the application o a highly integrated device.

In addition, according to a ferroelectrics thin-film coated substrate manufacture method according to the present invention, since a ferroelectrics thin-film of random orientation thin-film can be obtained and its orientation (crystallinity) can be controlled, the residual spontaneous polarization and the reacting electric field can be controlled dependently on a device to be applied and the degree of freedom can be greatly promoted. And, since the producing step can be carried out at a low temperature, various conventional devices such as a highly integrated device troublesome in high-temperature process can be coped with. Forming a coated thin-film by using the MOCVD process, not a conventional MOD or sol-gel process, enables a large-area thin-film to be produced with a good controllability at high speed, thereby promoting the productivity significantly.

Furthermore, according to a ferroelectrics thin-film coated substrate manufacture method according to the present invention, upgraded ferroelectric characteristics such as residual spontaneous polarization Pr=7.1 $\mu C/cm$ can be obtained even for extremely thin-film as not above 50 nm thick thin-film and therefore the inventive method is very effective for upgrading the characteristic of a ferroelectrics thin-film, improving the reliability and the like.

Because of comprising the aforesaid ferroelectrics thin-film coated substrate, a capacitor-structured nonvolatile memory according to the present invention permits a sufficient characteristic to be obtained as the nonvolatile memory.

Because of comprising the aforesaid ferroelectrics thin-film coated substrate, an MFMIS-FET-structured nonvolatile memory according to the present invention permits a sufficient characteristic to be obtained as the nonvolatile memory.

Many widely different embodiments of the present invention may be constructed without departing from the spirit and scope of the present invention. It should be understood that the present invention is not limited to the specific embodiments described in the specification, except as defined in the appended claims.

What is claimed is:

1. A ferroelectric thin-film coated substrate comprising:
   a buffer layer;
   a growth layer for allowing a ferroelectrics thin-film to grow, wherein said growth layer comprises a material having a layered crystal structure expressed in a chemical formula $Bi_2A_{m-1}B_mO_{3m+3}$, wherein A is selected from $Na^{1+}$, $K^{1+}$, $Pb^{2+}$, $Ca^{2+}$, $Sr^{2+}$, $Ba^{2+}$, and $Bi^{3+}$, B is selected from $Fe^{3+}$, $Ti^{3+}$, $Nb^{5+}$, $Ta^{5+}$, $W^{6+}$, and $Mo^{6+}$, and m is an integer not less than 1; and
   a ferroelectrics thin-film made of ferroelectric material having a layered structure expressed in a chemical formula $Bi_2A_{m-1}B_mO_{3m+3}$, wherein A is selected from $Na^{1+}$, $K^{1+}$, $Pb^{2+}$, $Ca^{2+}$, $Sr^{2+}$, $Ba^{2+}$, and $Bi^{3+}$, B is selected from $Fe^{3+}$, $Ti^{4+}$, $Nb^{5+}$, $Ta^{5+}$, $W^{6+}$, and $Mo^{6+}$, and m is an integer not less than 1;
   these being successively formed on a substrate.

2. The ferroelectrics thin-film coated substrate as set forth in claim 1, wherein said growth layer and said ferroelectrics thin-film comprise the same material and said buffer layer comprises at least one of the elements of the material constituting said growth layer and said ferroelectrics thin-film.

3. The ferroelectrics thin-film coated substrate as set forth in claim 2, wherein said ferroelectrics thin-film, said growth layer and said buffer layer comprise $Bi_4Ti_3O_{12}$, $Bi_4Ti_3O_{12}$ and titanium oxide, respectively.

4. A capacitor-structured nonvolatile memory comprising the ferroelectrics thin-film coated substrate as set forth in any of claims 1, 2 or 3.

5. An MFMIS-FET-structured nonvolatile memory comprising the ferroelectrics thin-film coated substrate as set forth in any of claims 1, 2 or 3.

6. A method for manufacturing a ferroelectrics thin-film coated substrate by forming a buffer layer and a ferroelectrics thin-film on a substrate by the MOCVD process, wherein a growth layer for allowing a ferroelectrics thin-film to grow is formed on the buffer layer after forming a buffer layer and further a ferroelectrics thin-film is formed on the growth layer at lower thin-film forming temperatures than that of the growth layer,
   wherein said growth layer comprises a material having a layered crystal structure expressed in a chemical formula $Bi_2A_{m-1}B_mO_{3m+3}$, wherein A is selected from $Na^{1+}$, $K^{1+}$, $Pb^{2+}$, $Ca^{2+}$, $Sr^{2+}$, $Ba^{2+}$, and $Bi^{3+}$, B is selected from $Fe^{3+}$, $Ti^{4+}$, $Nb^{5+}$, $Ta^{5+}$, $W^{6+}$, and $Mo^{6+}$, and m is an integer not less than 1; and
   wherein the ferroelectrics thin-film made of ferroelectric material has a layered structure expressed in a chemical formula $Bi_2A_{m-1}B_mO_{3m+3}$, wherein A is selected from $Na^{1+}$, $K^{1+}$, $Pb^{2+}$, $Ca^{2+}$, $Sr^{2+}$, $Ba^{2+}$, and $Bi^{3+}$, B is selected from $Fe^{3+}$, $Ti^{4+}$, $Nb^{5+}$, $Ta^{5+}$, $W^{6+}$, $Mo^{6+}$, and m is an integer not less than 1.

7. The method for manufacturing a ferroelectrics thin-film coated substrate as set forth in claim 6, wherein a bismuth-based oxide ferroelectrics thin-film having a layered crystal structure is formed as said ferroelectrics thin-film, a bismuth-based oxide ferroelectrics thin-film of the same material as that of said ferroelectrics thin-film is formed as said growth layer, and a thin-film containing the component elements of the material constituting said growth layer and said ferroelectrics thin-film is formed as said buffer layer.

8. The method for manufacturing a ferroelectrics thin-film coated substrate as set forth in claim 7, wherein, after forming a titanium oxide thin-film as said buffer layer, a $Bi_4Ti_3O_{12}$ thin-film is formed at thin-film forming temperatures of 400° C. to 650° C. as said growth layer and a $Bi_4Ti_3O_{12}$ thin-film is formed at thin-film forming temperatures of 300° C. to 400° C. as said ferroelectrics thin-film.

9. The method for manufacturing a ferroelectrics thin-film coated substrate as set forth in claim 8, wherein, the thin-film forming temperature of $Bi_4Ti_3O_{12}$ thin-film of said growth layer is set at 400° C. to 470° C.

10. A method for manufacturing a ferroelectrics thin-film coated substrate by forming a buffer layer and a ferroelectrics thin-film on a substrate by the MOCVD process, wherein after forming a buffer layer on a substrate, a growth layer for growing a ferroelectrics thin-film is formed on the buffer layer, a ferroelectrics thin-film is formed on the growth layer at lower thin-film forming temperatures than that of the growth layer, and heat treatment is applied.

11. The method for manufacturing a ferroelectrics thin-film coated substrate as set forth in claim 10, wherein after forming a titanium oxide thin-film as said buffer layer, a $Bi_4Ti_3O_{12}$ thin-film is formed at thin-film forming temperatures of 400° C. to 650° C. as said growth layer, a $Bi_4Ti_3O_{12}$ thin-film is formed at thin-film forming temperatures of 300° C. to 400° C. as said ferroelectrics thin-film, and heat treatment at 500° C. to 700° C. is applied.

12. The method for manufacturing a ferroelectrics thin-film coated substrate as set forth in claim 11, wherein, the thin-film forming temperature of $Bi_4Ti_3O_{12}$ thin-film of said growth layer is set at 400° C. to 470° C.

* * * * *